United States Patent
Gardner et al.

(10) Patent No.: US 12,408,321 B2
(45) Date of Patent: Sep. 2, 2025

(54) 3D HORIZONTAL MEMORY CELL WITH SEQUENTIAL 3D VERTICAL STACKING

(71) Applicant: Tokyo Electron Limited, Tokyo (JP)

(72) Inventors: Mark I. Gardner, Cedar Creek, TX (US); H. Jim Fulford, Marianna, FL (US); Partha Mukhopadhyay, Jacksonville, FL (US)

(73) Assignee: Tokyo Electron Limited, Tokyo (JP)

( * ) Notice: Subject to any disclaimer, the term of this patent is extended or adjusted under 35 U.S.C. 154(b) by 464 days.

(21) Appl. No.: 18/075,242

(22) Filed: Dec. 5, 2022

(65) Prior Publication Data

US 2023/0301062 A1 Sep. 21, 2023

Related U.S. Application Data

(60) Provisional application No. 63/320,457, filed on Mar. 16, 2022.

(51) Int. Cl.
| | |
|---|---|
| *H10D 62/00* | (2025.01) |
| *H01L 25/065* | (2023.01) |
| *H10B 12/00* | (2023.01) |
| *H10D 30/67* | (2025.01) |
| *H10D 62/13* | (2025.01) |
| *H10D 62/17* | (2025.01) |

(52) U.S. Cl.
CPC ......... *H10B 12/30* (2023.02); *H01L 25/0657* (2013.01); *H10B 12/03* (2023.02); *H10B 12/05* (2023.02); *H10D 30/6735* (2025.01); *H10D 62/151* (2025.01); *H10D 62/235* (2025.01)

(58) Field of Classification Search
CPC ........ H10B 12/30; H10B 12/03; H10B 12/05; H10B 53/20; H10B 53/30; H10B 12/488; H01L 29/516; H01L 29/6684; H01L 29/78391; H01L 29/66969; H01L 29/7869
USPC .......................................................... 257/296
See application file for complete search history.

(56) References Cited

U.S. PATENT DOCUMENTS

| | | | | |
|---|---|---|---|---|
| 2013/0285199 A1* | 10/2013 | Nagai | ................... | H10B 12/488 |
| | | | | 257/532 |
| 2014/0227854 A1* | 8/2014 | Ozaki | ...................... | H10D 1/68 |
| | | | | 438/399 |
| 2015/0069482 A1* | 3/2015 | Mueller | ................. | H10D 89/10 |
| | | | | 257/334 |
| 2016/0365440 A1* | 12/2016 | Suk | ....................... | H10D 30/024 |
| 2017/0140996 A1* | 5/2017 | Lin | ....................... | H10D 64/017 |
| 2018/0151438 A1* | 5/2018 | Chiang | ............... | H10D 84/038 |
| 2018/0366375 A1* | 12/2018 | Chen | .................... | H10D 62/116 |
| 2020/0105617 A1* | 4/2020 | Wang | .................... | H10D 30/031 |

(Continued)

*Primary Examiner* — Sheikh Maruf
(74) *Attorney, Agent, or Firm* — Oblon, McClelland, Maier & Neustadt, L.L.P.

(57) ABSTRACT

A semiconductor device includes a memory cell unit positioned over a substrate. The memory cell unit includes a transistor and a capacitor. The capacitor includes an inner conductor, a capacitor dielectric all around the inner conductor, an outer conductor all around the capacitor dielectric, and dielectric support structures below the inner conductor. The capacitor is elongated in a length direction parallel to a working surface of the substrate, and the dielectric support structures are spaced along the length direction. The transistor includes a channel structure, a gate structure all around the channel structure, and source/drain (S/D) regions on opposing ends of the channel structure.

20 Claims, 21 Drawing Sheets

(56) References Cited

U.S. PATENT DOCUMENTS

| | | | |
|---|---|---|---|
| 2020/0105889 A1* | 4/2020 | Liaw | H10D 84/83 |
| 2020/0105902 A1* | 4/2020 | Ching | H10D 62/115 |
| 2020/0119164 A1* | 4/2020 | Tsau | H01L 21/28185 |
| 2020/0135932 A1* | 4/2020 | Wang | H10D 64/021 |
| 2021/0020747 A1* | 1/2021 | Chen | H10D 89/10 |

* cited by examiner

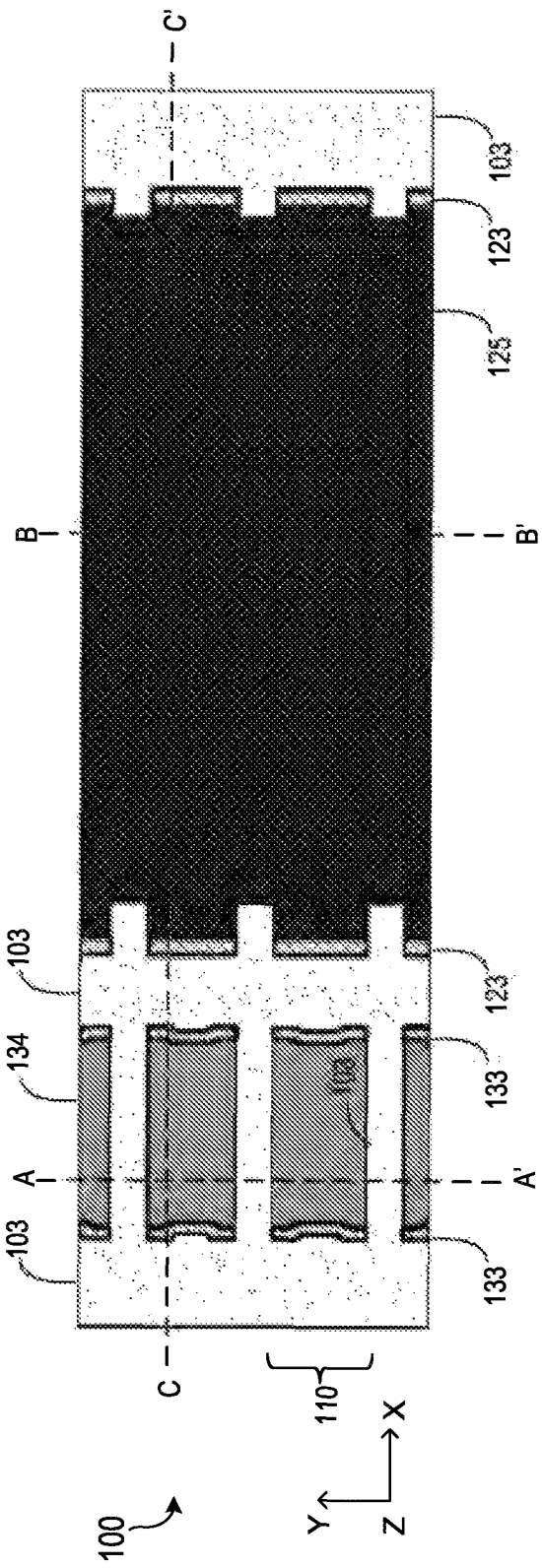
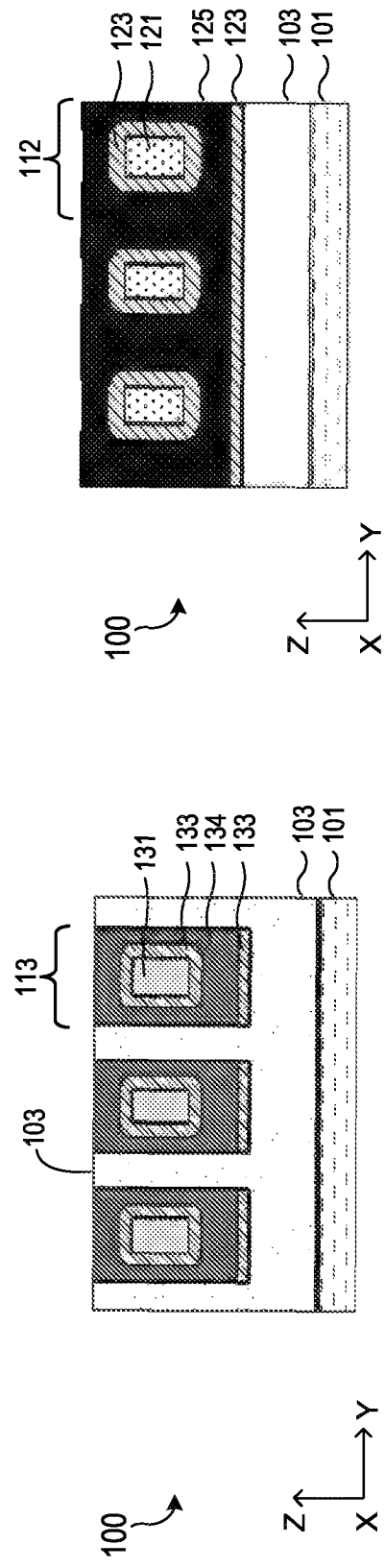
Figure 1A
Figure 1B
Figure 1C

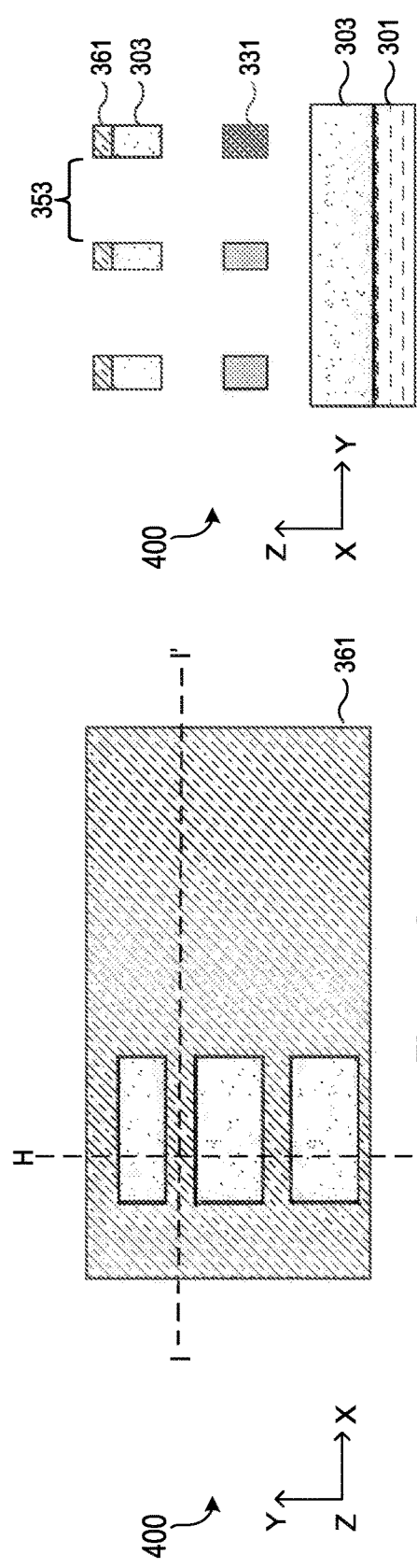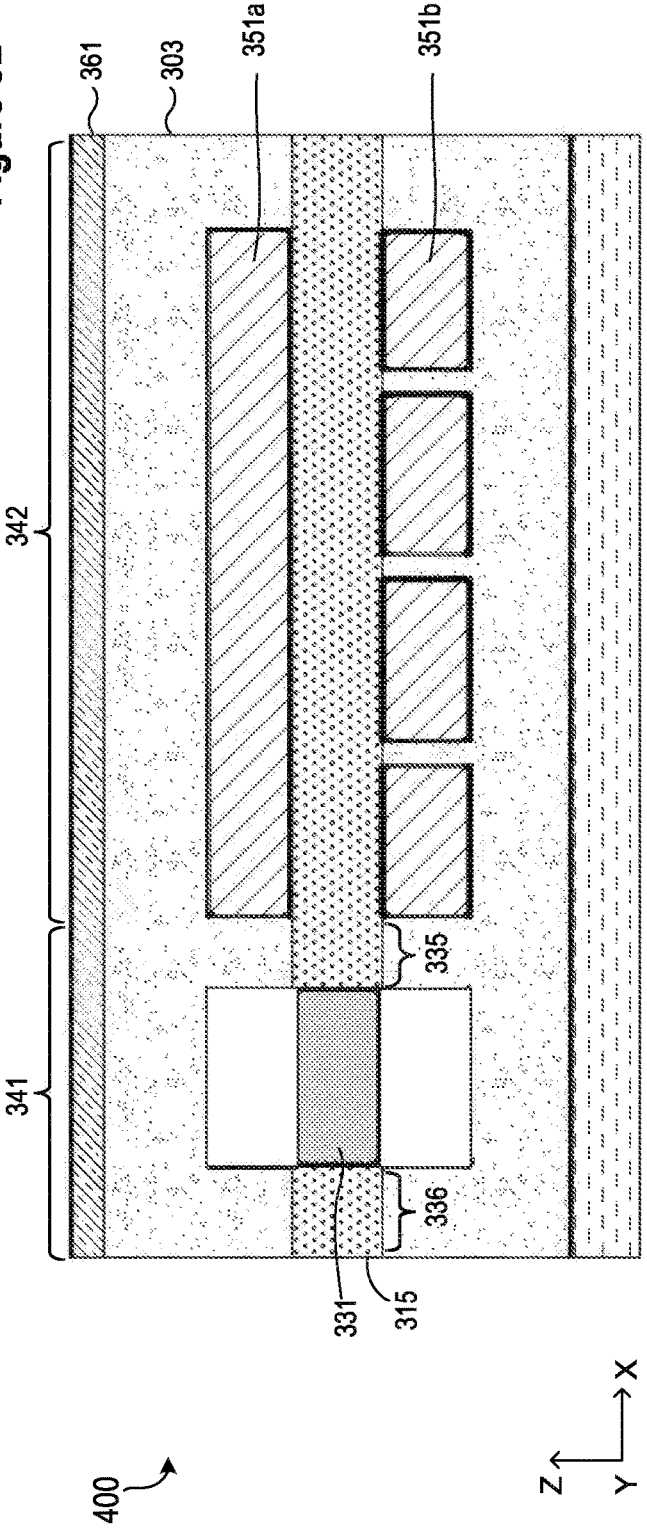
Figure 5A
Figure 5B
Figure 5C

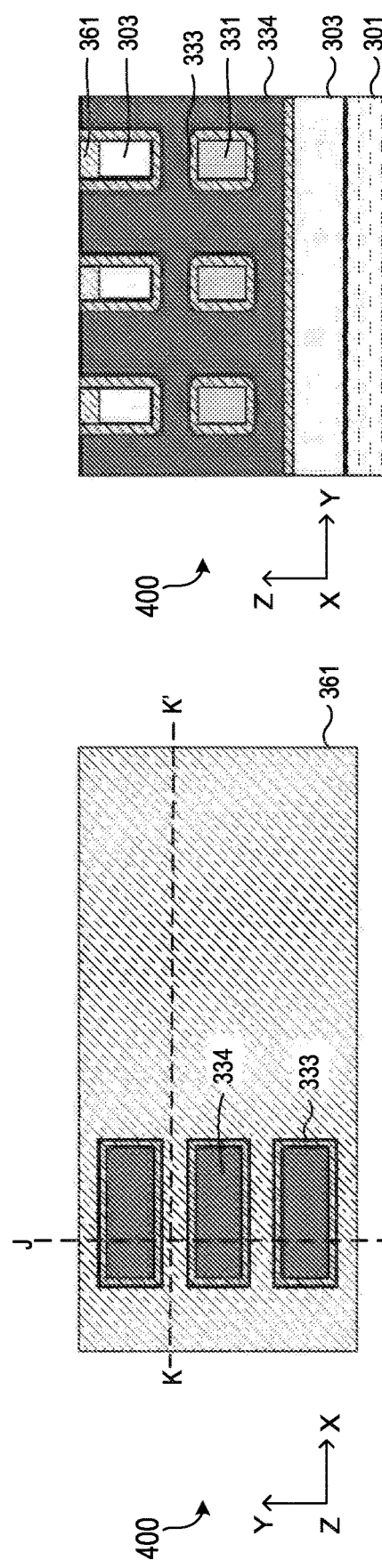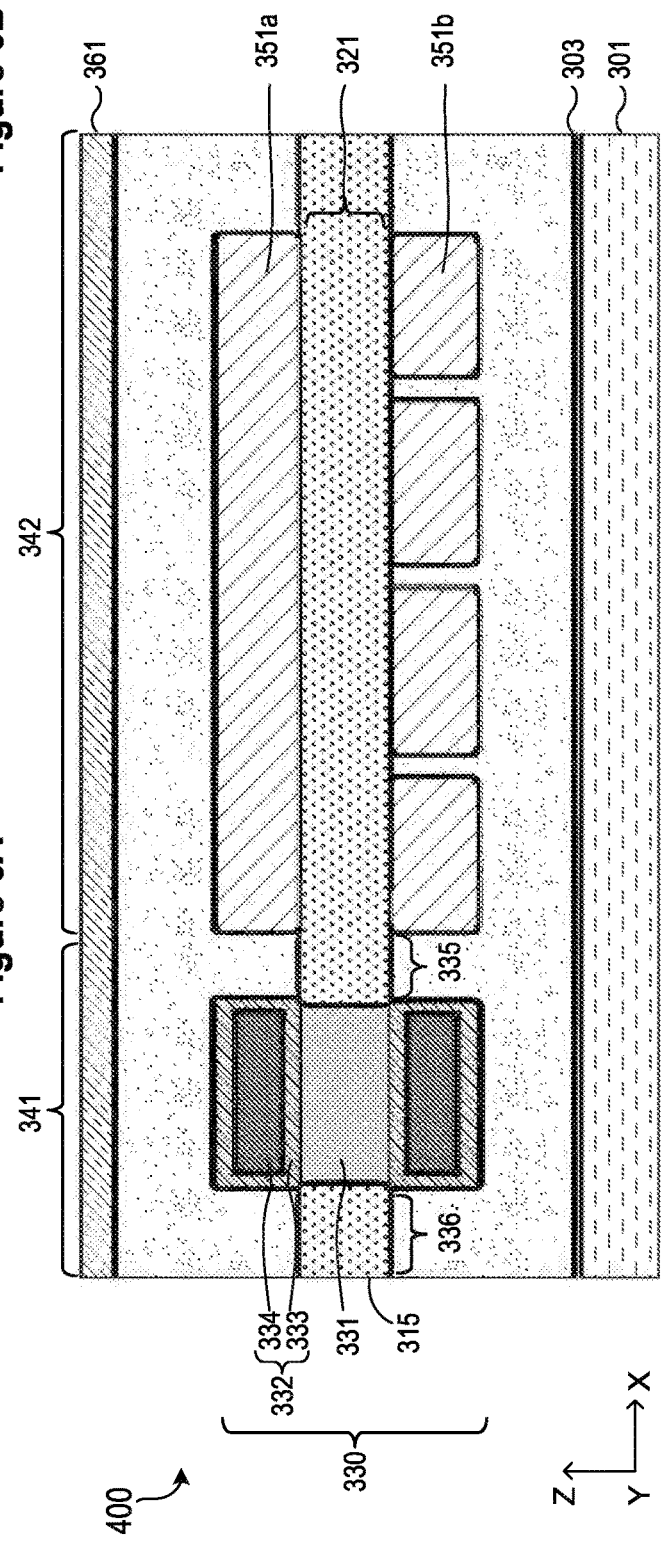
Figure 6A
Figure 6B
Figure 6C

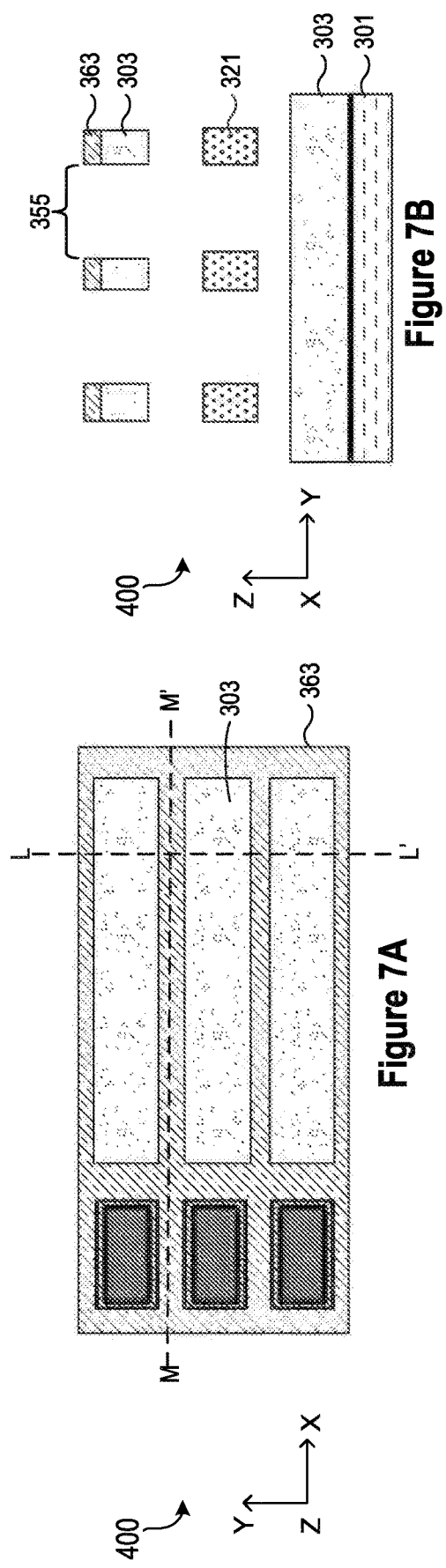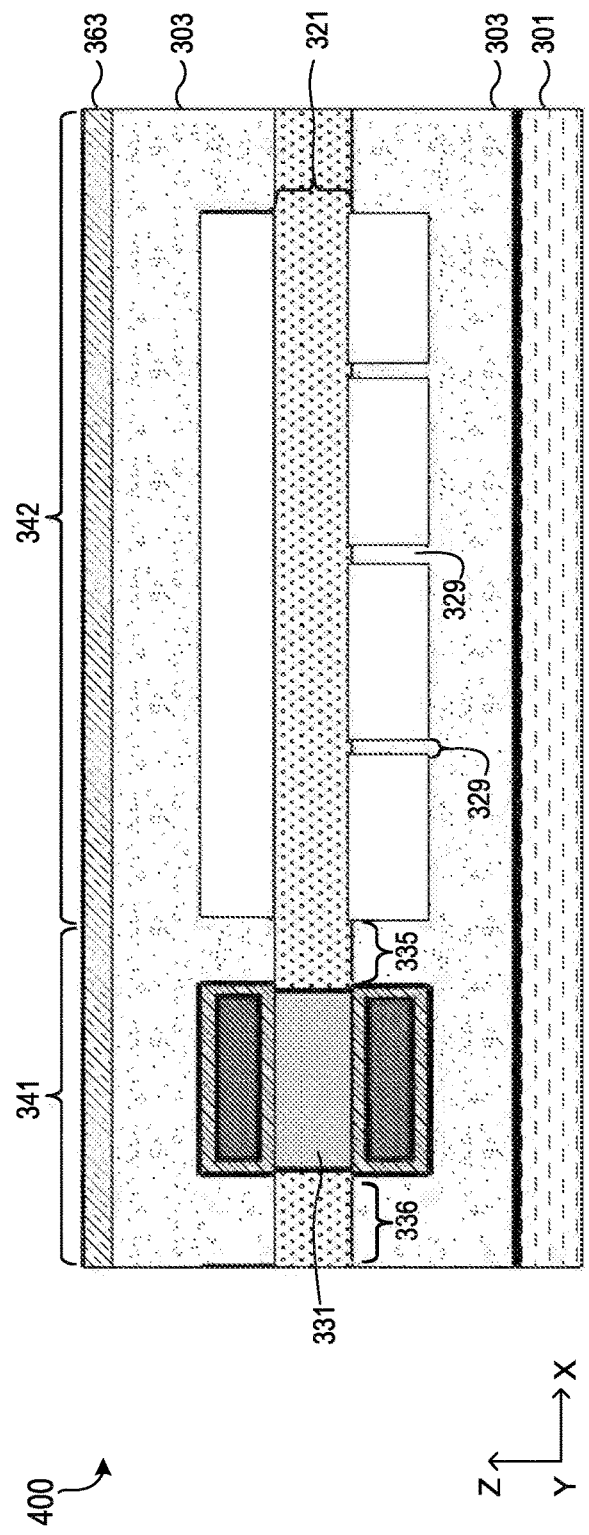
Figure 7A
Figure 7B
Figure 7C

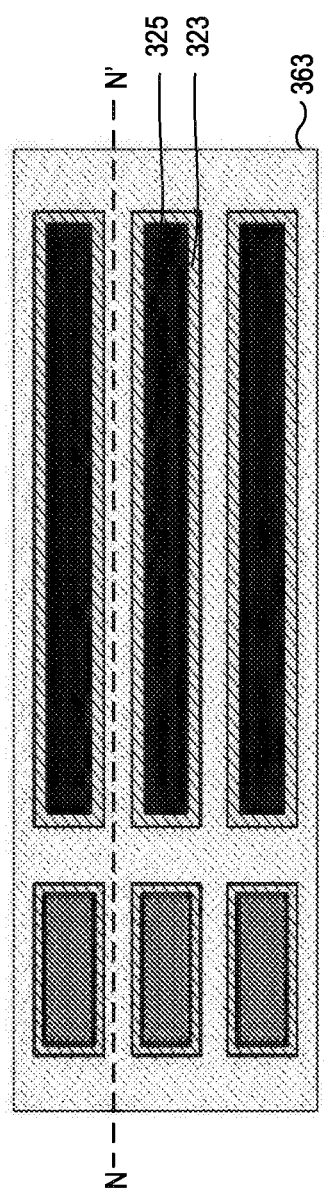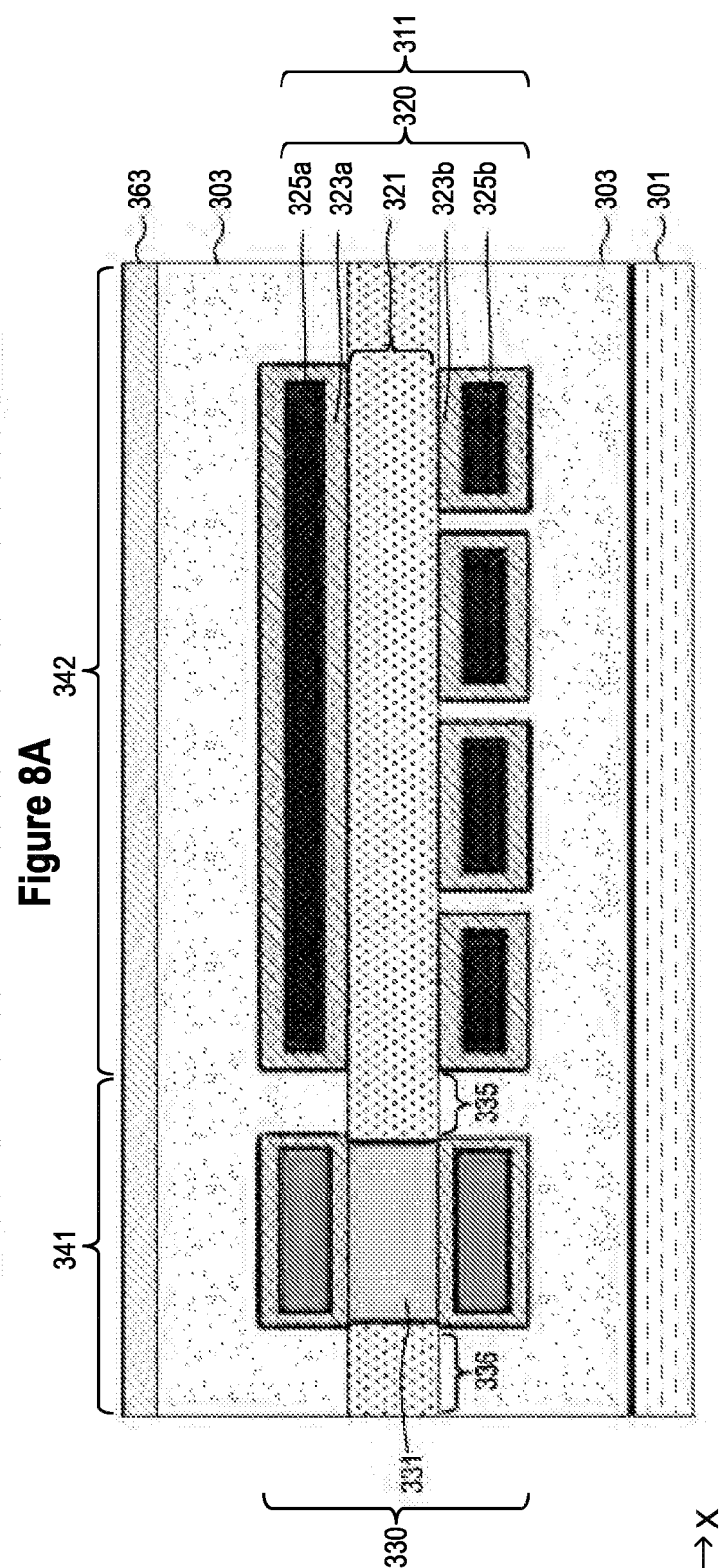
Figure 8A
Figure 8B

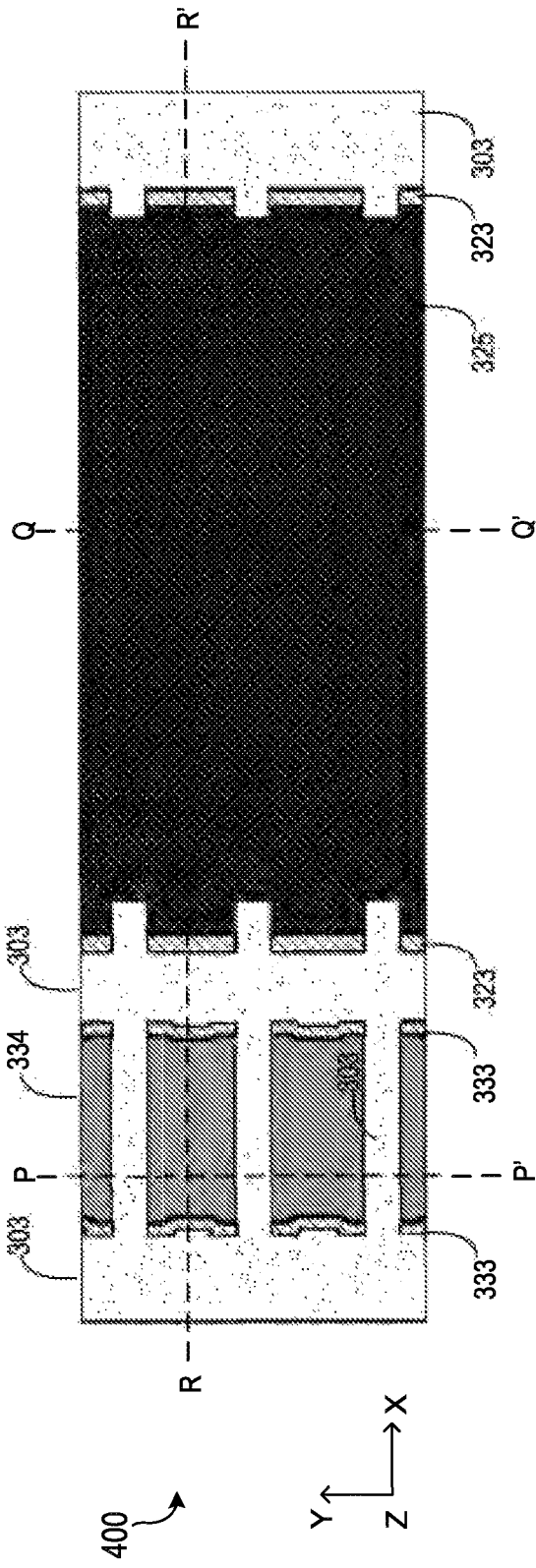
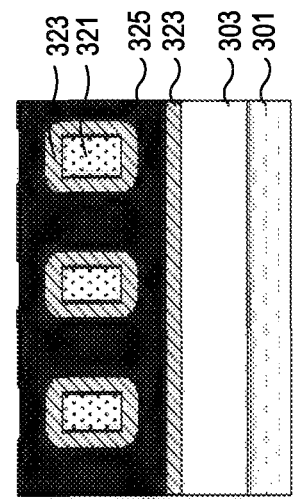
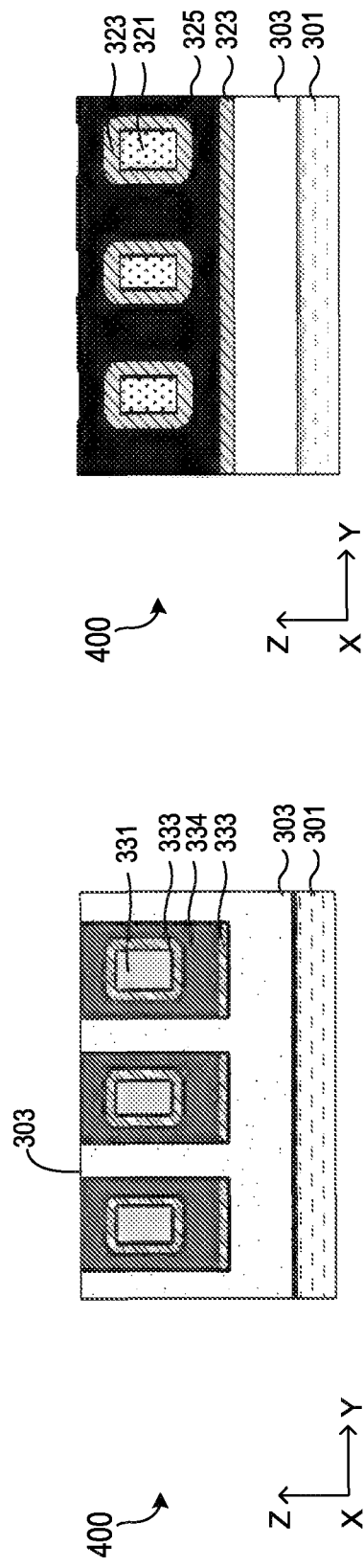
Figure 9A
Figure 9B
Figure 9C

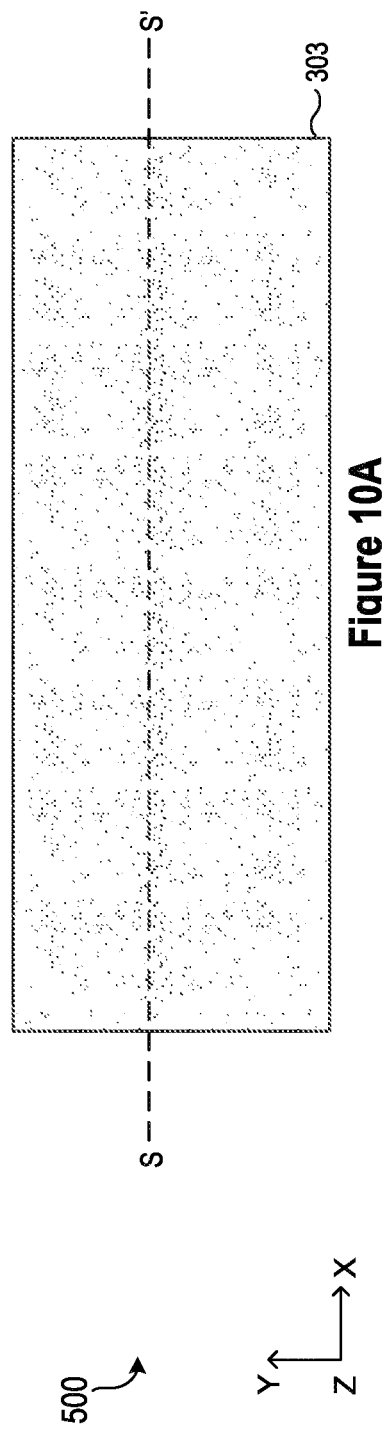
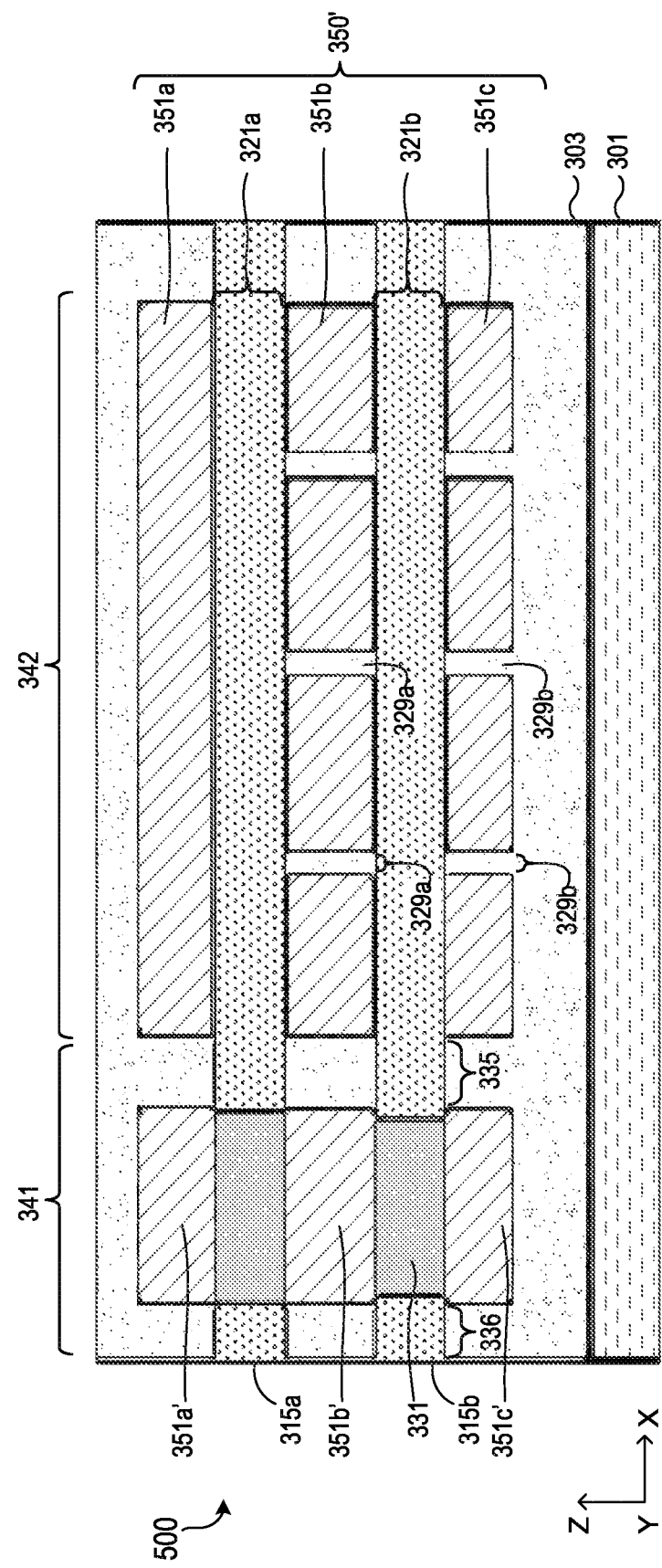
Figure 10A
Figure 10B

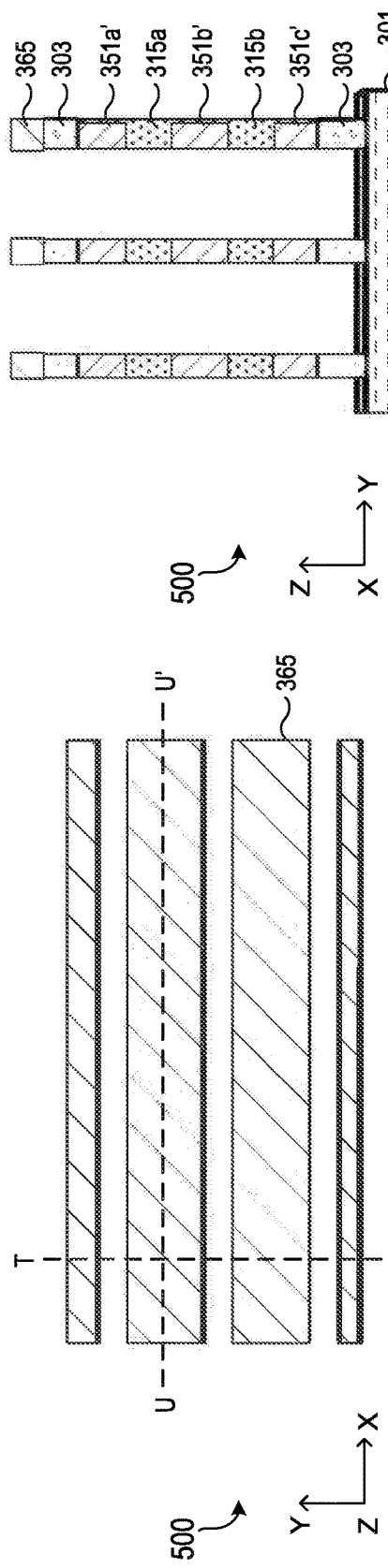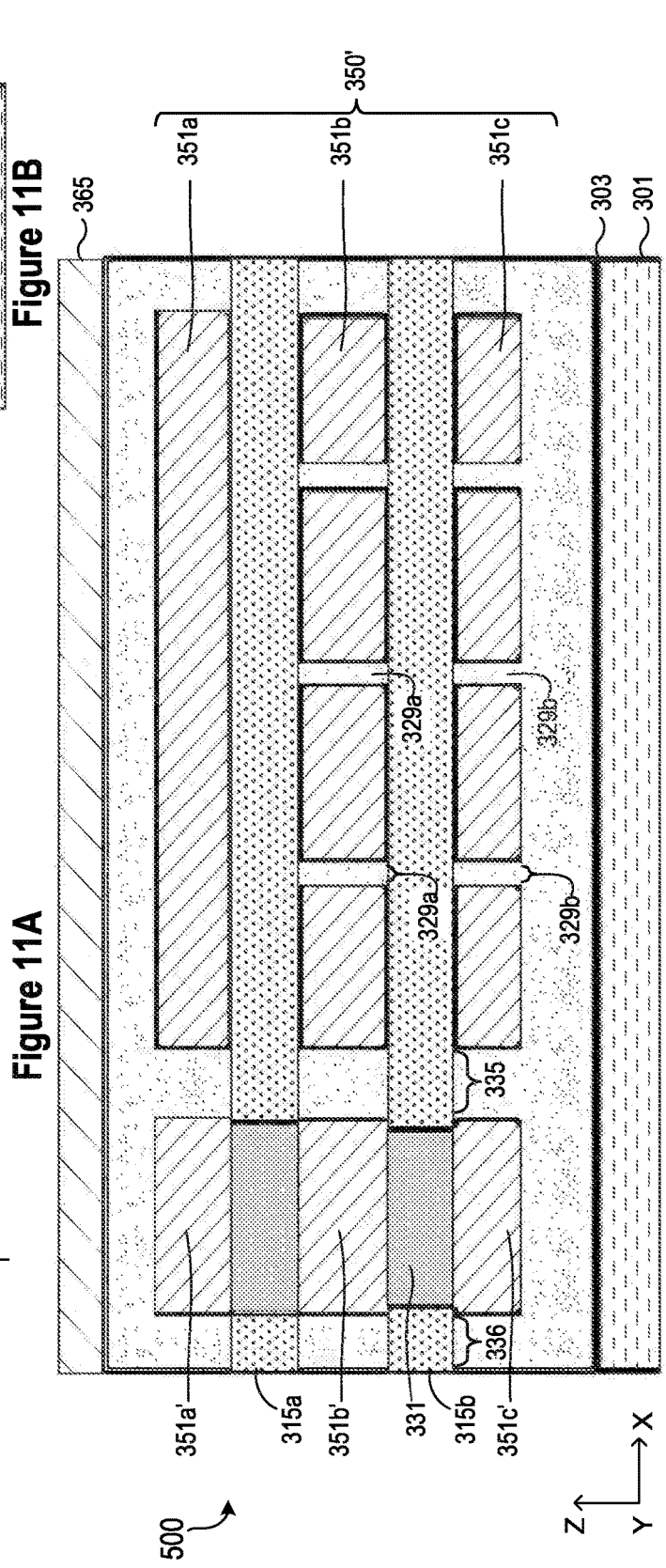
Figure 11A
Figure 11B
Figure 11C

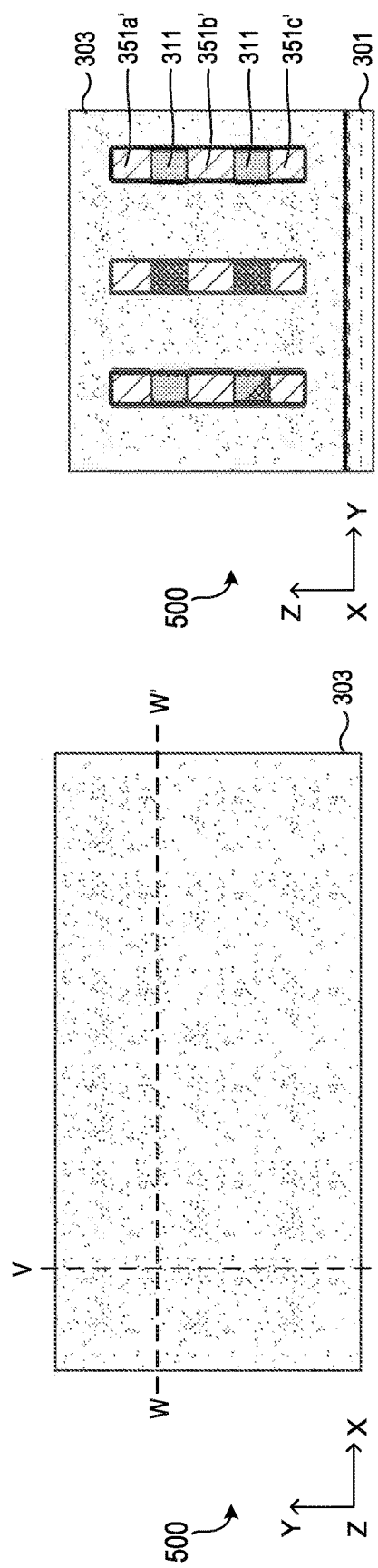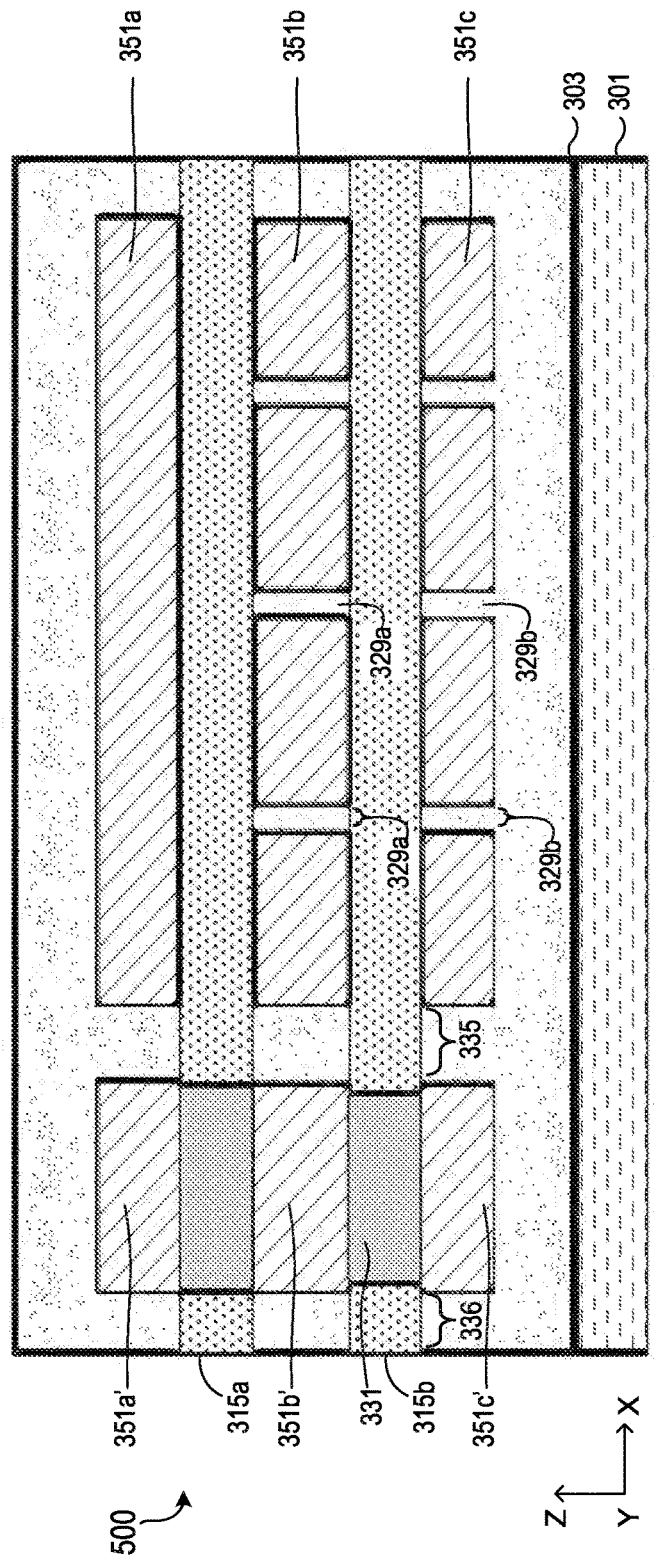

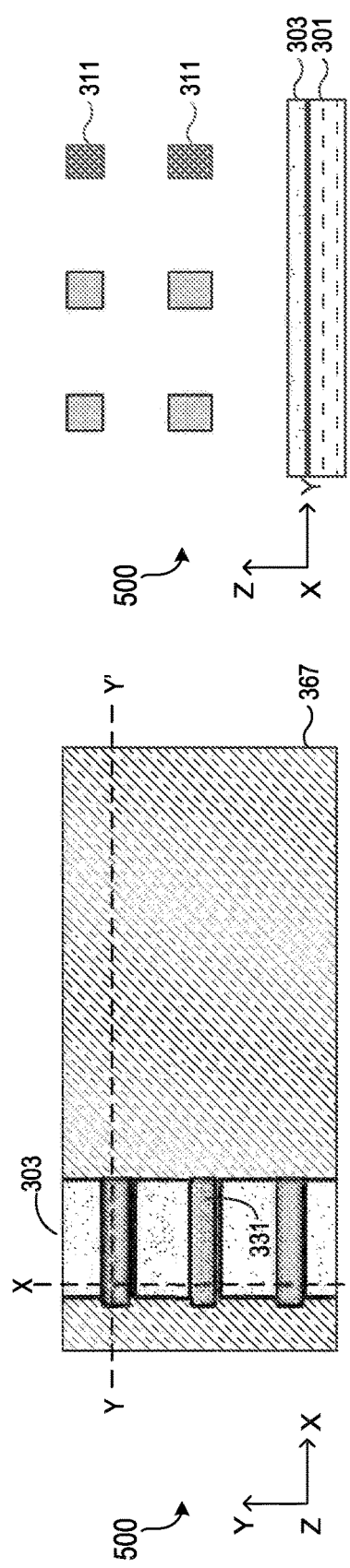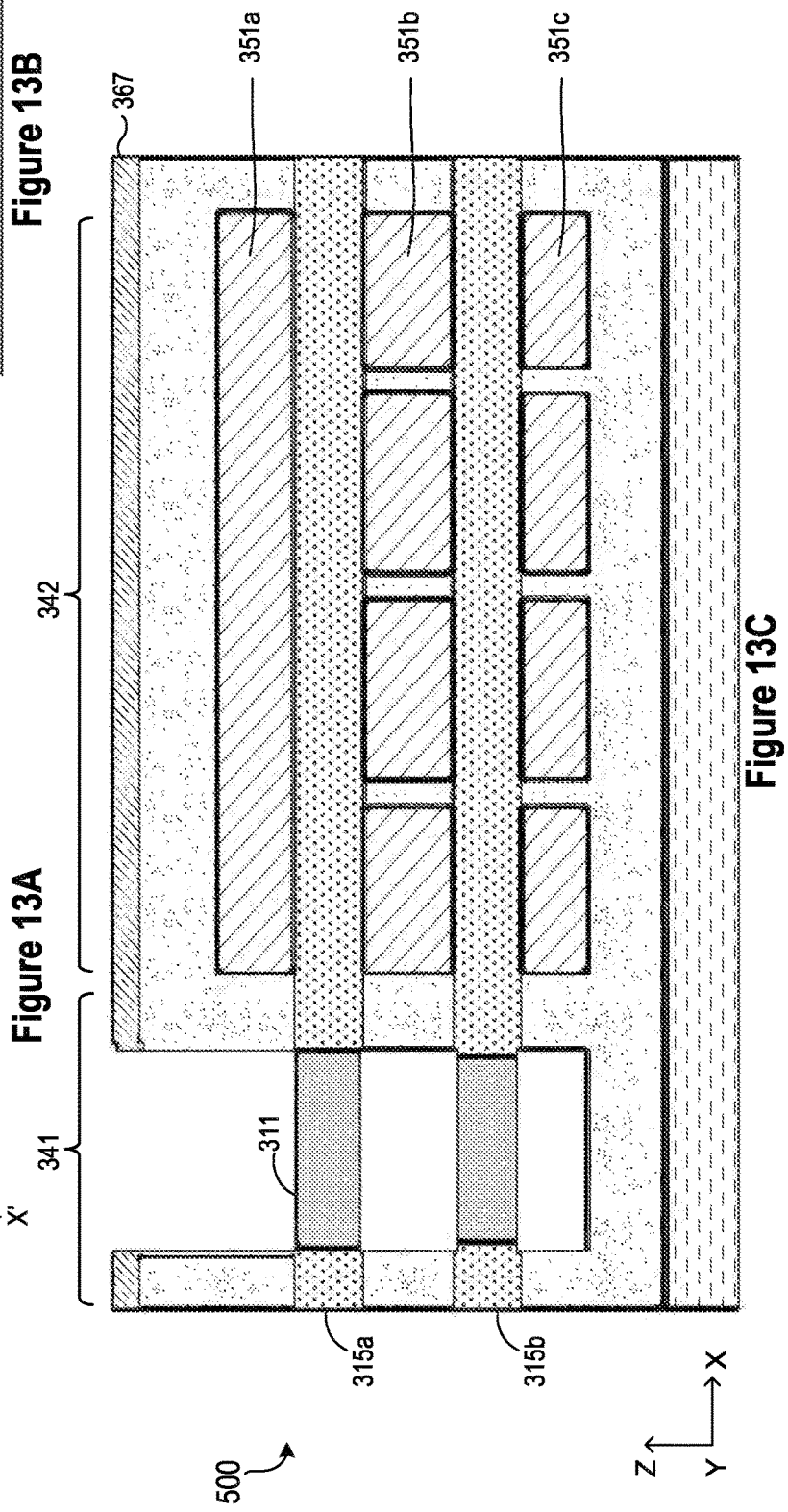
Figure 13A
Figure 13B
Figure 13C

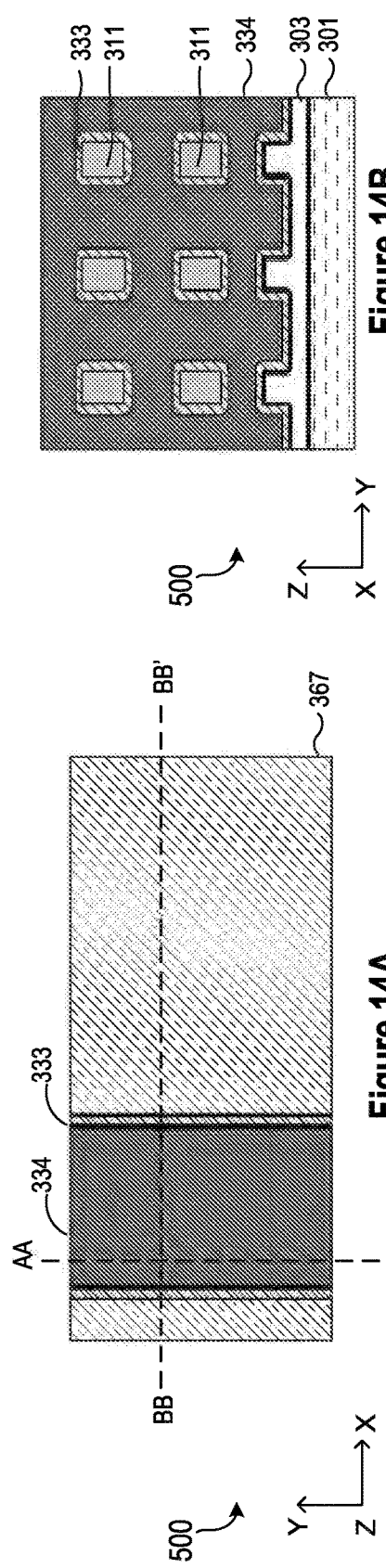
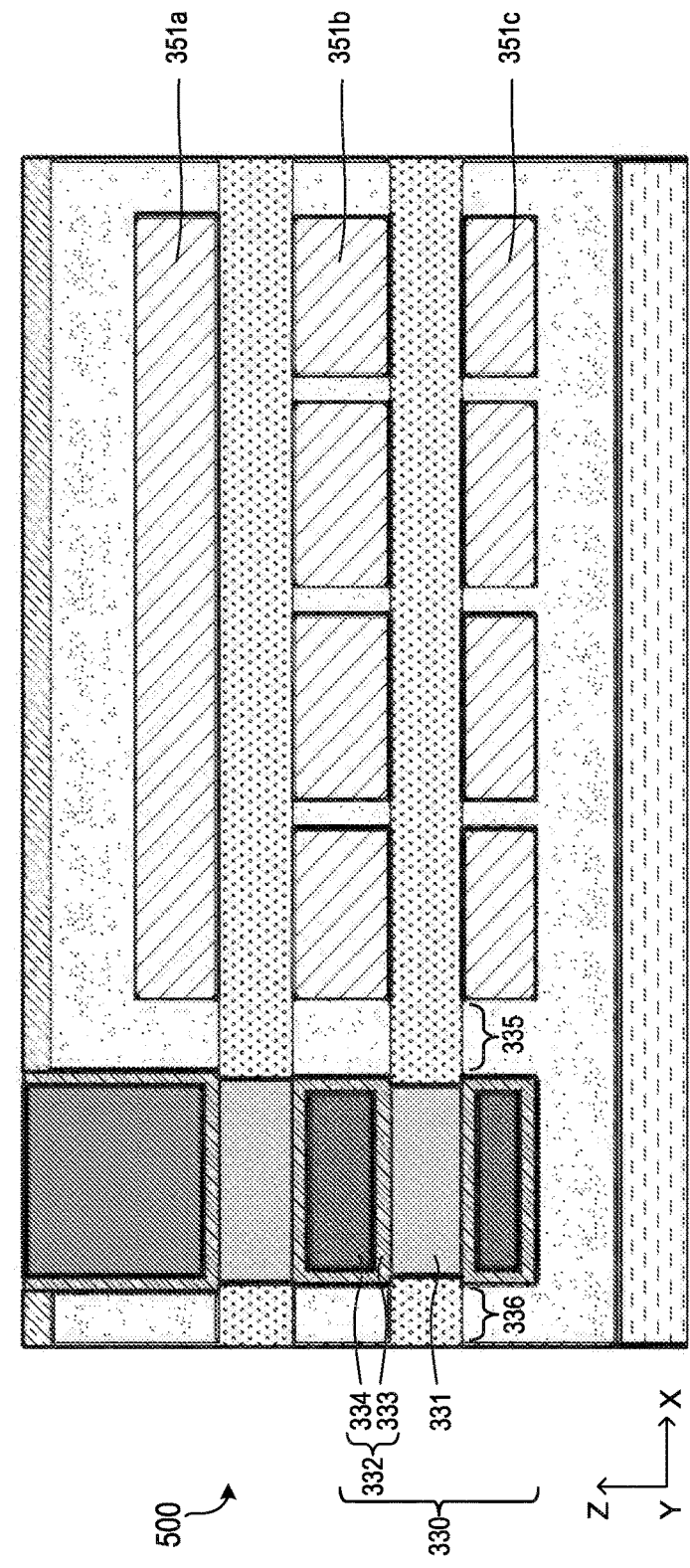
Figure 14A
Figure 14B
Figure 14C

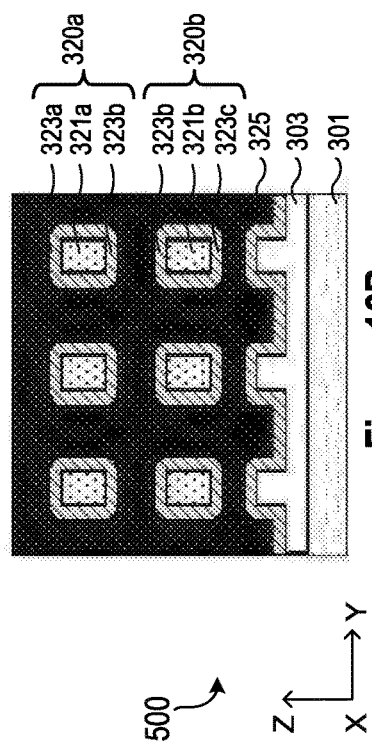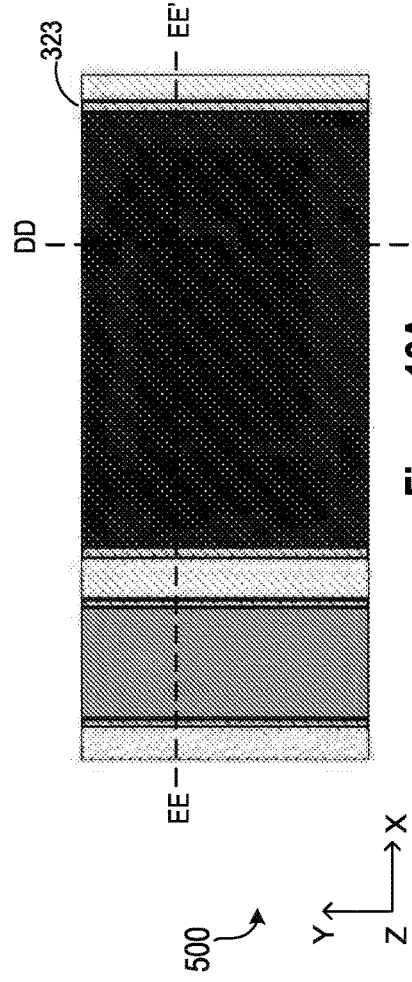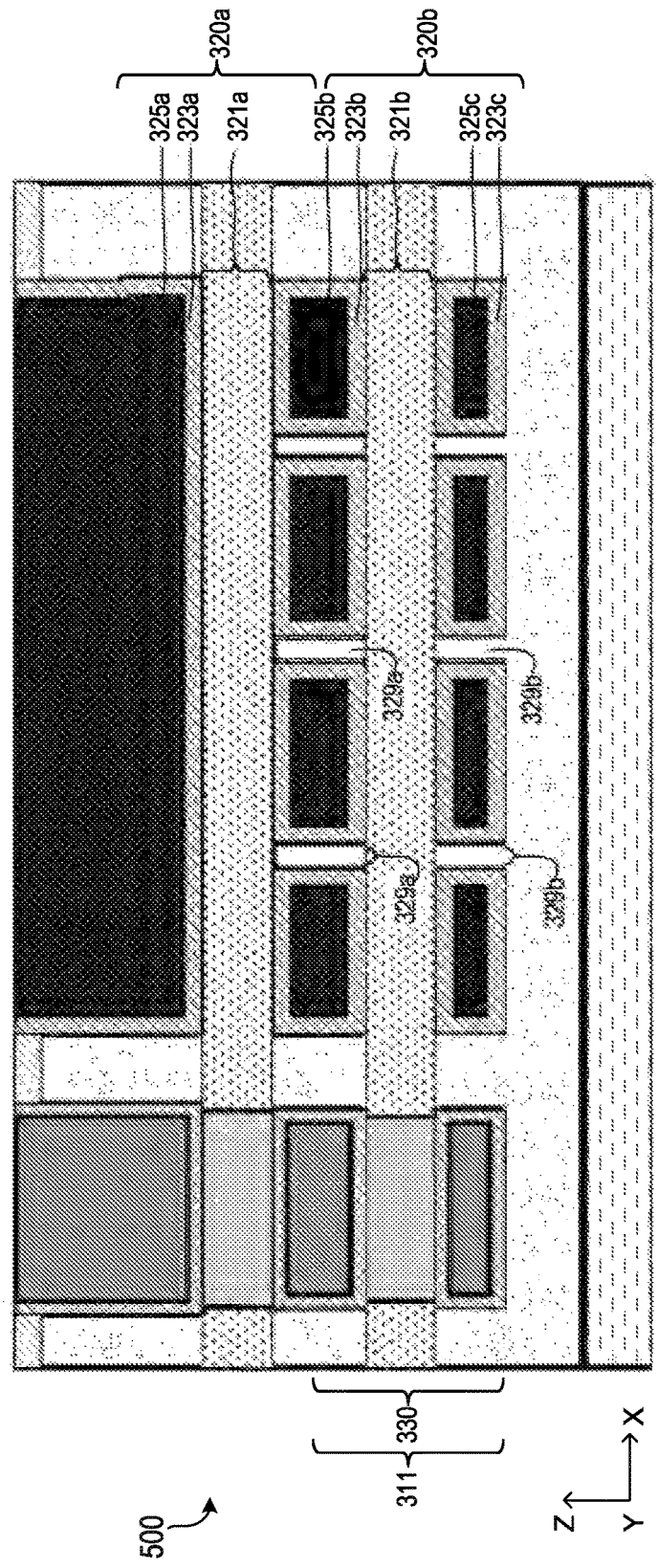
Figure 16B
Figure 16A
Figure 16C

US 12,408,321 B2

3D HORIZONTAL MEMORY CELL WITH SEQUENTIAL 3D VERTICAL STACKING

INCORPORATION BY REFERENCE

This present disclosure claims the benefit of U.S. Provisional Application No. 63/320,457, filed on Mar. 16, 2022, which is incorporated herein by reference in its entirety.

FIELD OF THE INVENTION

This disclosure relates to microelectronic devices including semiconductor devices, transistors, and integrated circuits, and methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on of each other.

SUMMARY

According to a first aspect of the disclosure, a semiconductor device is provided. The semiconductor device includes a memory cell unit positioned over a substrate. The memory cell unit includes a transistor and a capacitor. The capacitor includes an inner conductor, a capacitor dielectric all around the inner conductor, an outer conductor all around the capacitor dielectric, and dielectric support structures below the inner conductor. The capacitor is elongated in a length direction parallel to a working surface of the substrate, and the dielectric support structures are spaced along the length direction. The transistor includes a channel structure, a gate structure all around the channel structure, and source/drain (S/D) regions on opposing ends of the channel structure.

In some embodiments, the capacitor dielectric and the outer conductor, below the inner conductor, are divided by the dielectric support structures and are discontinuous along the length direction. In some embodiments, the capacitor dielectric and the outer conductor, above the inner conductor, are undivided and are continuous along the length direction.

In some embodiments, the dielectric support structures are in contact with the inner conductor.

In some embodiments, the dielectric support structures are surrounded by the outer conductor below the inner conductor.

In some embodiments, a plurality of the memory cell units are stacked over the substrate in a vertical direction perpendicular to the working surface of the substrate. In some embodiments, each capacitor dielectric and each outer conductor, below an uppermost inner conductor, are divided by respective dielectric support structures and are discontinuous along the length direction. An uppermost capacitor dielectric and an uppermost outer conductor, above the uppermost inner conductor, are undivided and are continuous along the length direction. In some embodiments, the plurality of the memory cell units includes a common gate structure for a plurality of transistors, and a common outer conductor for a plurality of capacitors.

In some embodiments, the cell unit includes a semiconductor layer that includes a source region of the transistor, the channel structure of the transistor, a drain region of the transistor, and the inner conductor of the capacitor connected in series. In some embodiments, the semiconductor layer includes doped silicon. The channel structure includes a different dopant type from the source region, the drain region and the inner conductor.

In some embodiments, the inner conductor, the capacitor dielectric, and the outer conductor are co-axial.

In some embodiments, a plurality of the memory cell units are arranged in a width direction that is parallel to a working surface of the substrate and perpendicular to the length direction. The semiconductor device further includes isolation structures that separate a plurality of transistors of the plurality of the memory cell units, and a common outer conductor for a plurality of capacitors of the plurality of the memory cell units.

In some embodiments, the inner conductor includes a doped semiconductor. The capacitor dielectric includes a high-k dielectric. The outer conductor includes a metal.

According to a second aspect of the disclosure, a method of manufacturing a semiconductor device is provided. The method includes forming a layer stack over a substrate. The layer stack is formed by forming a semiconductor layer over the substrate. Dielectric support structures are formed below and in contact with the semiconductor layer and spaced along a length direction parallel to a working surface of the substrate. A sacrificial material is formed over and below the semiconductor layer. The sacrificial material below the semiconductor layer is divided by the dielectric support structures. A capacitor is formed by removing the sacrificial material while the dielectric support structures remain in contact with the semiconductor layer. The capacitor is elongated in the length direction. A transistor is formed adjacent to the capacitor.

In some embodiments, the dielectric support structures are configured to provide structural support to prevent collapse of the semiconductor layer when the sacrificial material is removed.

In some embodiments, the semiconductor layer is doped such that the semiconductor layer includes source/drain regions and a channel structure of the transistor, and an inner conductor of the capacitor. In some embodiments, a portion of the sacrificial material in contact with the inner conductor is removed. A capacitor dielectric is formed all around the inner conductor. An outer conductor is formed all around the capacitor dielectric. In some embodiments, the capacitor dielectric and the outer conductor, below the inner conductor, are divided by the dielectric support structures and are discontinuous along the length direction. The capacitor dielectric and the outer conductor, above the inner conductor, are undivided and are continuous along the length direction. In some embodiments, a portion of the sacrificial material in contact with the channel structure is removed. A gate structure is formed all around the channel structure.

In some embodiments, the semiconductor layer is divided in a width direction that is parallel to the working surface of the substrate and perpendicular to the length direction. A plurality of transistors are formed and spaced in the width direction. A plurality of capacitors are formed in the width direction.

In some embodiments, the forming the layer stack further includes forming an additional semiconductor layer over the semiconductor layer. Additional dielectric support structures are formed below and in contact with the additional semiconductor layer and spaced along the length direction. The sacrificial material is formed over the additional semiconductor layer. The sacrificial material below the additional semiconductor layer is divided by the additional dielectric support structures.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

FIG. 1A shows a top view of a semiconductor device in accordance with one embodiment of the present disclosure.

FIGS. 1B, 1C and 1D show vertical cross-sectional views taken along line cuts AA', BB' and CC' in FIG. 1A respectively in accordance with some embodiments of the present disclosure.

FIGS. 4A, 5A, 6A, 7A, 8A and 9A show top views of a semiconductor device at various intermediate steps of manufacturing, in accordance with some embodiments of the present disclosure.

FIGS. 4B, 5B, 5C, 6B, 6C, 7B, 7C, 8B, 9B, 9C and 9D show vertical cross-sectional views of a semiconductor device at various intermediate steps of manufacturing, in accordance with some embodiments of the present disclosure.

FIGS. 10A, 11A, 12A, 13A, 14A, 15A, 16A and 17A show top views of a semiconductor device at various intermediate steps of manufacturing, in accordance with some embodiments of the present disclosure.

FIGS. 10B, 11B, 11C, 12B, 12C, 13B, 13C, 14B, 14C, 15B, 16B, 16C, 17B, 17C and 17D show vertical cross-sectional views of a semiconductor device at various intermediate steps of manufacturing, in accordance with some embodiments of the present disclosure.

DETAILED DESCRIPTION

Figure 1D:
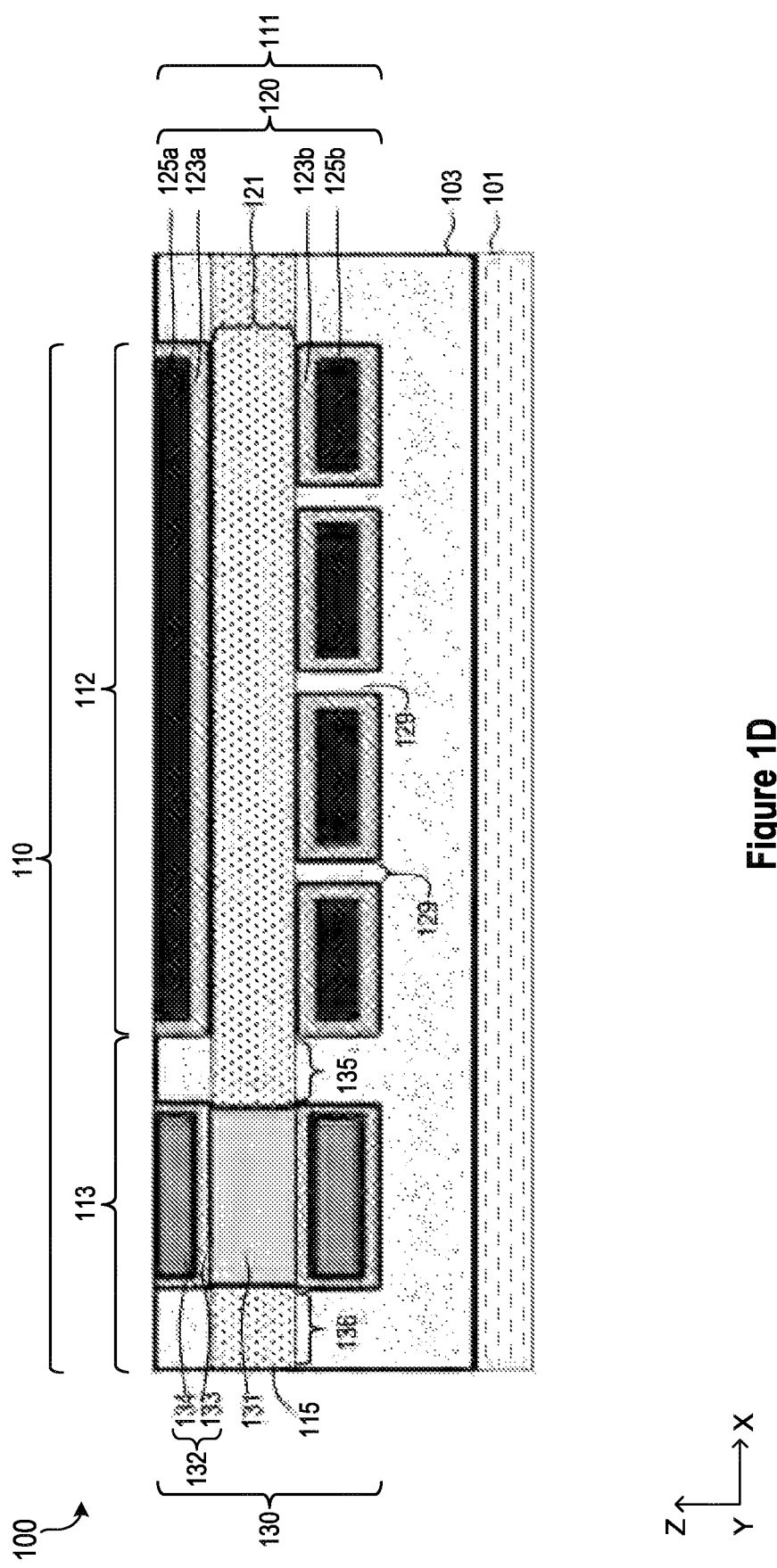

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

3D integration, i.e. the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array, SoC (System on a chip)) is being pursued.

Techniques herein integrate a novel 3D horizontal memory cell with sequential 3D vertical stacking. Any deposited material can be used for the channel regions. Example embodiments include making a DRAM cell that has one pass transistor and one capacitor that is horizontal integrated. A 3D stack of N tall DRAM cells is achieved herein. Another novel aspect is supporting a relatively large capacitor in the horizontal dimension by dielectric support pillars between adjacent 3D nanosheet capacitor build. Embodiments include an integration technique to make a co-axial cylinder capacitor for ultimate charge storage for DRAM memory cell. Examples show 3D nanosheet transistor and wrapped-around 3D capacitor with doped polysilicon. There are options for connections for source/drain, gate and capacitor shown with the new memory cell architecture herein.

FIG. 1A shows a top view of a semiconductor device 100 in accordance with one embodiment of the present disclosure. FIGS. 1B, 1C and 1D show vertical cross-sectional views taken along line cuts AA', BB' and CC' in FIG. 1A respectively in accordance with some embodiments of the present disclosure.

As illustrated, the semiconductor device 100 includes a stack of dynamic random access memory (DRAM) cell units (hereinafter referred to as a memory stack 110) over a substrate 101 in the Z direction. The memory stack 110 includes a stack of capacitors (hereinafter referred to as a capacitor stack 112) and a stack of transistors (hereinafter referred to as a transistor stack 113) adjacent to each other. Consider a cell unit 111 (or a memory cell unit 111) of the memory stack 110 for example. The cell unit 111 includes a capacitor 120 that is configured to be electrically coupled to a transistor 130 adjacent to the capacitor 120.

Specifically, the capacitor 120 includes an inner conductor 121, a capacitor dielectric 123 (also shown as 123a and 123b) all around the inner conductor 121, and an outer conductor 125 (also shown as 125a and 125b) all around the capacitor dielectric 123. The capacitor 120 can also include dielectric support structures 129 that are spaced along the X direction and positioned below the inner conductor 121. The dielectric support structures 129 can be in (direct) contact with the inner conductor 121 and thus configured to provide structural support (or physical support, or mechanical support) to prevent collapse of the inner conductor 121 during manufacturing, as will be explained in detail later.

As shown in FIG. 1D, the capacitor dielectric 123b and the outer conductor 125b, below the inner conductor 121 in the Z direction, are divided by the dielectric support structures 129 and are thus discontinuous along the X direction. The capacitor dielectric 123a and the outer conductor 125a, above the inner conductor 121 in the Z direction, are undivided and are thus continuous along the X direction. While not shown, in some embodiments, the dielectric support structures 129 are surrounded by the capacitor dielectric 123b and the outer conductor 125b below the inner conductor 121 in the XY plane. In addition, the dielectric support structures 129 can be rectangular or cylindrical pillars. In this case, the capacitor dielectric 123b and the outer conductor 125b, below the inner conductor 121 in the Z direction, can be undivided and continuous along the X direction in a different XZ cross-sectional view (not shown).

In a non-limiting example, the inner conductor 121 includes a doped semiconductor material. The capacitor dielectric 123 includes a high-k dielectric, and the outer conductor 125 includes a metal material. Notably, the capacitor 120 is elongated in the X direction (relative to the Z direction). Dimensions and shape of the capacitor 120 (e.g. a length of the inner conductor 121 in the X direction and a thickness of the inner conductor 121 in the Z direction) may vary, depending on specific design requirements. For example, the inner conductor 121 can be a nanosheet while the capacitor dielectric 123 and the outer conductor 125 are disposed all around the nanosheet in the YZ plane. The inner conductor 121, the capacitor dielectric 123 and the outer conductor 125 can be co-axial. Additionally, the capacitor dielectric 123 may include extra portions that are disposed between the outer conductor 125b and the dielectric support structures 129.

The transistor 130 includes a channel structure 131 and a gate structure 132 all around the channel structure 131. The gate structure 132 includes at least one gate dielectric 133 (such as a high-k dielectric) and at least one gate metal 134 (such as a work function metal (WFM)). The transistor 130 also includes S/D regions (e.g. 135 and 136) positioned on two opposing ends of the channel structure 131. Accordingly, the channel structure 131 can be configured to have a current flow path in the X direction. In this example, the transistor 130 includes a source region 136 and a drain region 135.

Further, the cell unit 111 can include a semiconductor layer 115 which includes the source region 136, the channel structure 131, the drain region 135 and the inner conductor 121 connected in series. In other words, the source region 136, the channel structure 131, the drain region 135 and the inner conductor 121 can be co-planar and configured to be electrically coupled. Therefore, the cell unit 111 can be configured to function as a horizontal cell and thus can be stacked in the Z direction. Particularly, the drain region 135 and the inner conductor 121 can be connected seamlessly or formed as a single piece.

In some embodiments, the semiconductor layer 115 includes doped silicon. The channel structure 131 can include a different dopant type from the source region 136, the drain region 135 and the inner conductor 121. In one example, the channel structure 131 includes p-type polysilicon while the source region 136, the drain region 135 and the inner conductor 121 include n-type polysilicon. In another example, the channel structure 131 includes n-type polysilicon while the source region 136, the drain region 135 and the inner conductor 121 include p-type polysilicon.

In some embodiments, the semiconductor device 100 can include dielectric materials, e.g. as shown by 103, 105, 123 and 133. The dielectric materials may also be referred to as isolation structures, isolation layers, diffusion breaks, gate dielectrics, capping layers, etc. depending on functions thereof. For example in FIG. 1B, the dielectric material 103 can separate transistor stacks (e.g. 113) from each other and thus be referred to as isolation structures. The dielectric materials may be the same or different from each other.

In the example of FIG. 1, the memory stack 110 includes one cell unit 111 stacked in the Z direction. That is, the capacitor stack 112 includes one capacitor 120 stacked in the Z direction while the transistor stack 113 includes one transistor 130 stacked in the Z direction. It should be understood that the memory stack 110 can include a plurality of or any number of cell units 111 stacked in the Z direction. Moreover, other cell units can be similar to the cell unit 111 while having some differences. For example, channel structures of cell units can include different chemical compositions from one another. That is, the channel structures can include different semiconductor materials, different dopants and/or different dopant concentration profiles. Similarly, inner conductors of capacitors can also include different chemical compositions from one another.

Further, the semiconductor device 100 can include any number of memory stacks 110 arranged in the Y direction in the XY plane. Isolation structures (e.g. 103) can separate a plurality of transistors of the plurality of the memory cell units 111 from each other in the Y direction. The semiconductor device 100 can include a (common) outer conductor 125 for a plurality of capacitors of the plurality of the memory cell units 111. In some embodiments, the isolation structures may extend further in the X direction to divide the (common) outer conductor 125 into independent outer conductors (not shown); that is, the plurality of capacitors can be separated in the Y direction by one or more dielectric materials.

Figure 2A:
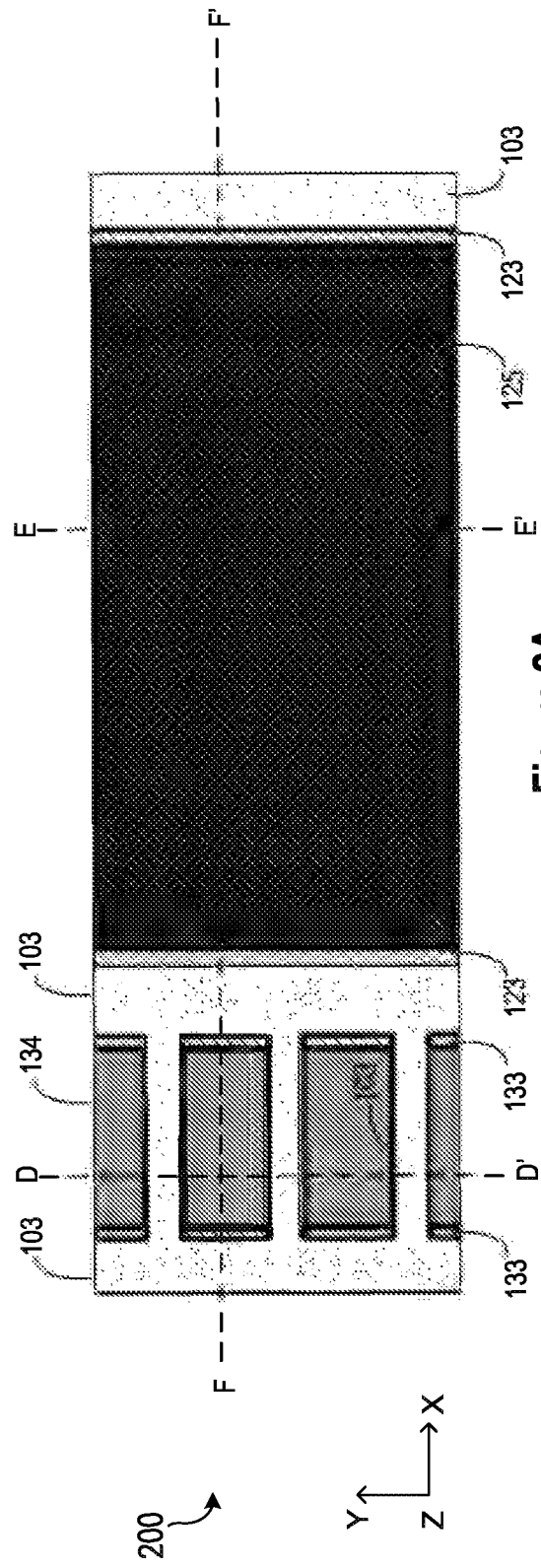
FIG. 2A shows a top view of a semiconductor device in accordance with another embodiment of the present disclosure.
Figure 2C:
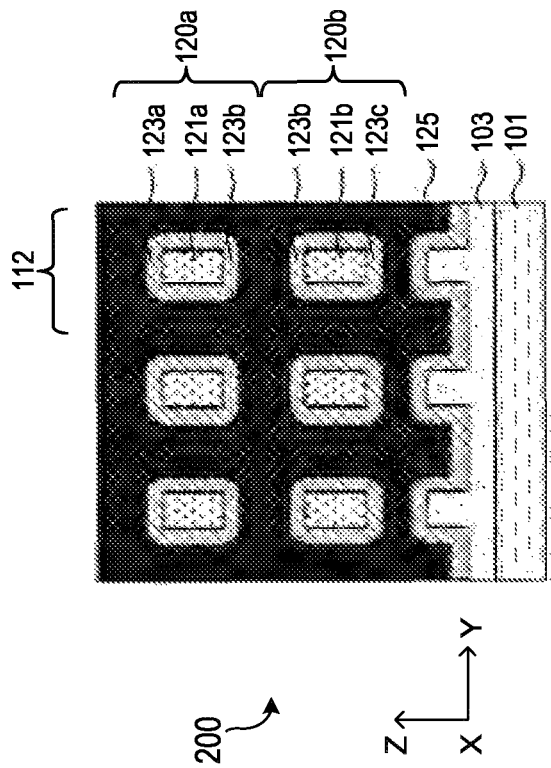
FIGS. 2B, 2C and 2D show vertical cross-sectional views taken along line cuts DD', EE' and FF' in FIG. 2A respectively in accordance with some embodiments of the present disclosure.
Figure 2B:
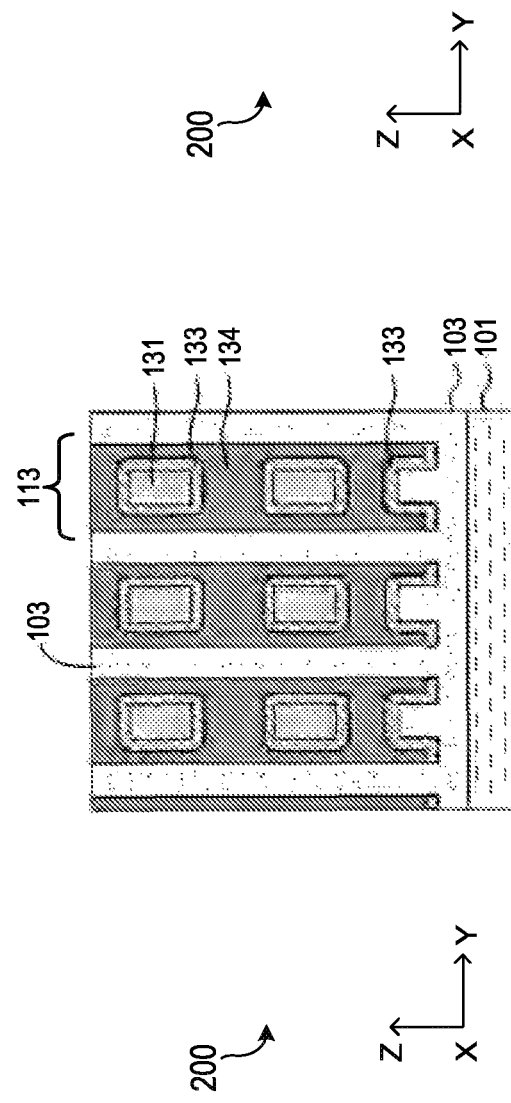
Figure 2D:
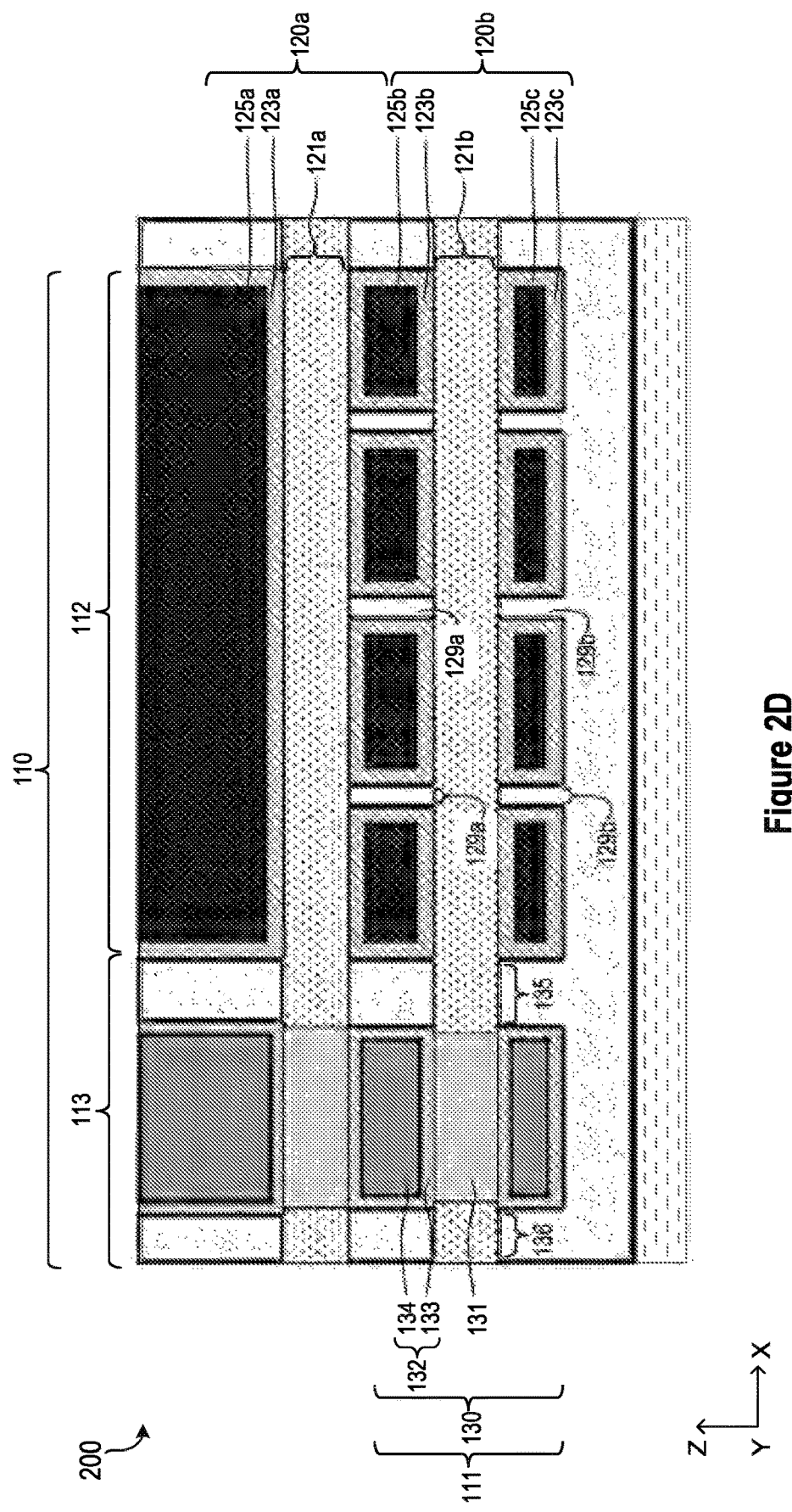

FIG. 2A shows a top view of a semiconductor device 200 in accordance with another embodiment of the present disclosure. FIGS. 2B, 2C and 2D show vertical cross-sectional views taken along line cuts DD', EE' and FF' in FIG. 2A respectively in accordance with some embodiments of the present disclosure. As the embodiment of the semiconductor device 200 is similar to the embodiment of the semiconductor device 100, descriptions herein will be provided with emphasis placed on difference. Particularly, similar or identical components are labeled with similar or identical numerals unless specified otherwise.

As illustrated, the semiconductor device 200 can include two cell units 111 stacked in the Z direction. Accordingly, the memory stack 110 includes a capacitor 120a stacked over a capacitor 120b. Similarly, the capacitor stack 112 includes inner conductors 121a and 121b, the capacitor dielectric 123 (also shown as 123a, 123b and 123c) and the outer conductor 125 (also shown as 125a, 125b and 125c). The capacitor stack 112 can also include dielectric support structures 129a and 129b, which correspond to the dielectric support structures 129.

In the examples of FIGS. 2A-2D, the capacitor dielectric 123a and the outer conductor 125a, above the inner conductor 121a in the Z direction, are undivided and are thus continuous along the X direction. The capacitor dielectric 123b and the outer conductor 125b, between the inner conductor 121a and the inner conductor 121b in the Z direction, are divided by the dielectric support structures 129a and are thus discontinuous along the X direction. The capacitor dielectric 123c and the outer conductor 125c, below the inner conductor 121b in the Z direction, are divided by the dielectric support structures 129b and are thus discontinuous along the X direction. Additionally, the outer conductor 125 can be a common outer conductor for a plurality of capacitors arranged in the XY plane as well as stacked in the Z direction.

As can be understood, in other embodiments (not shown), the semiconductor device 200 can include any number of cell units 111 stacked in the Z direction and thus any number of capacitors stacked in the Z direction. Accordingly, each capacitor dielectric (e.g. 123b and 123c) and each outer conductor (125b and 125c), below an uppermost inner conductor (e.g. 121a), are divided by respective dielectric support structures (e.g. 129a and 129b) and are discontinuous along the X direction. An uppermost capacitor dielectric (e.g. 123a) and an uppermost outer conductor (e.g. 125a), above the uppermost inner conductor (e.g. 121a), are undivided and are continuous along the X direction.

Still referring to FIGS. 2A-2D, the transistor stack 113 can include two transistors 130 stacked in the Z direction. The gate structure 132 can be a common gate structure for two transistors 130.

Figure 3:
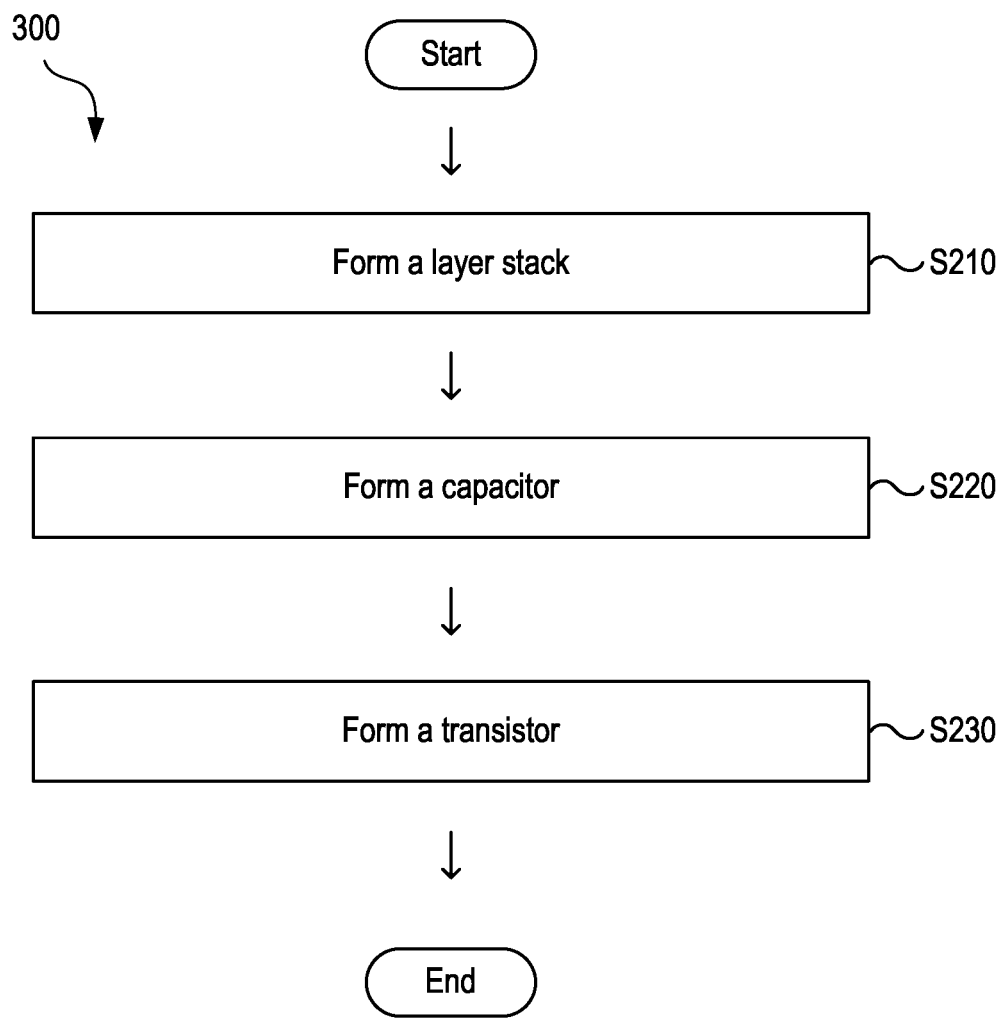
FIG. 3 shows a flow chart of a process for manufacturing a semiconductor device, in accordance with some embodiments of the present disclosure.

FIG. 3 shows a flow chart of a process 300 for manufacturing a semiconductor device, such as the semiconductor device 100, the semiconductor device 200 or the like, in accordance with some embodiments of the present disclosure. The process 300 starts with Step S210 where a layer stack is formed over a substrate. Particularly, a semiconductor layer can be formed over the substrate. Dielectric support structures can be formed below and in contact with the semiconductor layer and spaced along a length direction parallel to a working surface of the substrate. A sacrificial material can be formed over and below the semiconductor layer. The sacrificial material below the semiconductor layer is divided by the dielectric support structures.

The process 300 then proceeds to Step S220 where a capacitor is formed by removing the sacrificial material while the dielectric support structures remain in contact with the semiconductor layer. The capacitor is elongated in the length direction. The process 300 then proceeds to Step S220 by forming a transistor adjacent to the capacitor.

FIGS. 4A, 5A, 6A, 7A, 8A and 9A show top views of a semiconductor device 400 at various intermediate steps of manufacturing, in accordance with some embodiments of the present disclosure. For example, FIGS. 4A-9A can show horizontal DRAM access with high density nanosheet transistor and wrapped-around capacitor with doped polysilicon. There are options for connections for source/drain, gate and capacitor. Such an embodiment is highly suitable for hierarchical design of N-number stack.

Figure 4A:
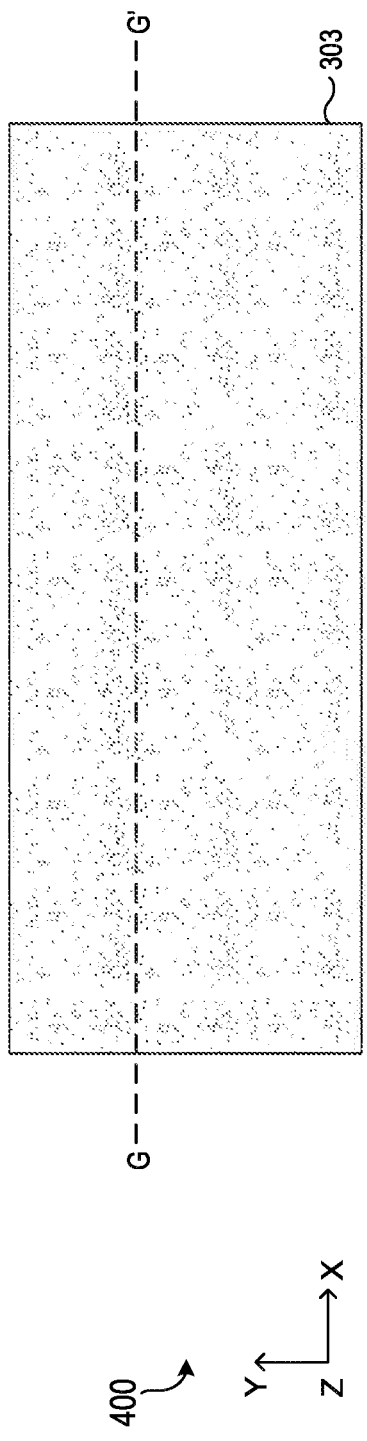
Figure 4B:
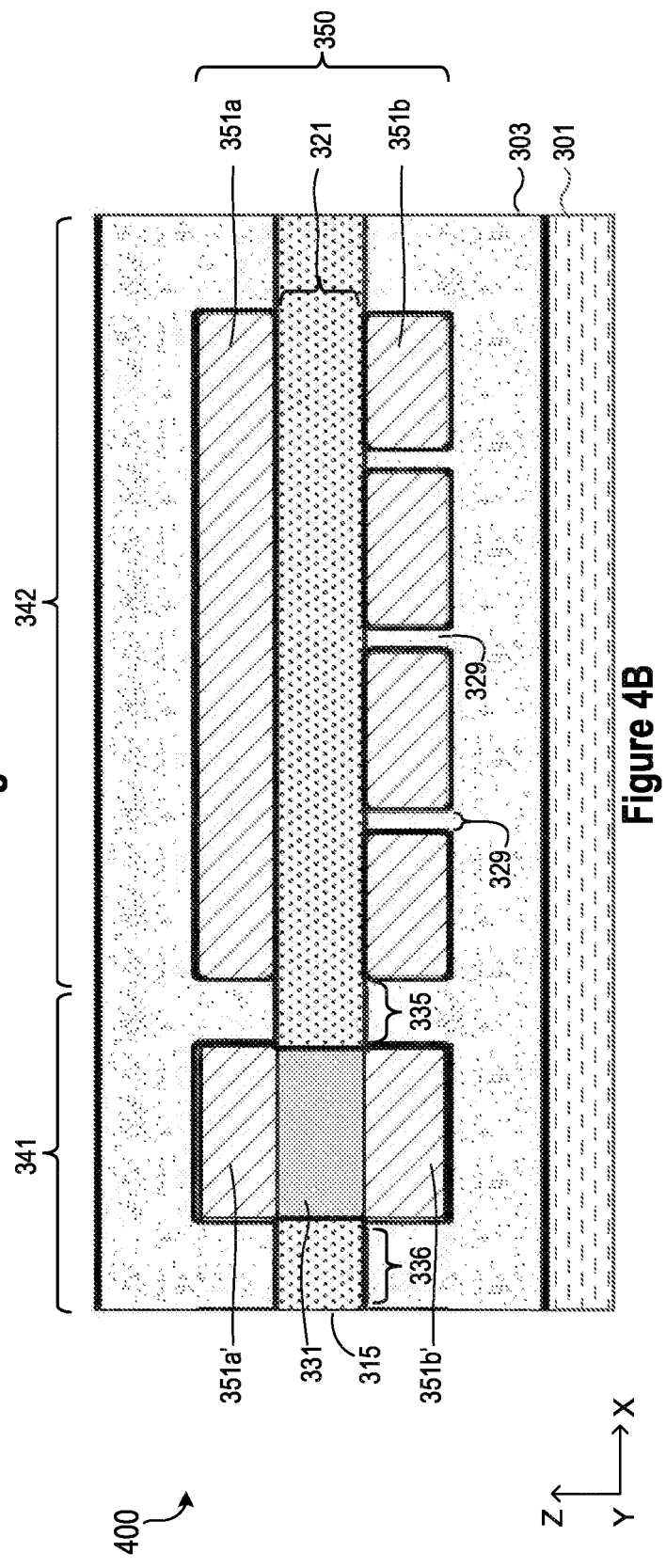

FIG. 4B can show a vertical cross-sectional view taken along the line cut GG' in FIG. 4A. In FIGS. 4A-4B, a layer stack 350 is formed over a substrate 301. Specifically, the layer stack 350 includes a semiconductor layer 315 formed over the substrate 301, dielectric support structures 329 and a sacrificial material 351 (e.g. shown as 351a, 351a', 351b and 351b'). The dielectric support structures 329 are formed below and in contact with the semiconductor layer 351 and spaced along the X direction. The sacrificial material 351 is formed over (e.g. 351a and 351a') and below (e.g. 351b and 351b') the semiconductor layer 315. The semiconductor layer 315 can include a source region 336, a channel structure 331 and a drain region 335 in a transistor region 341 and an inner conductor 321 in a capacitor region 342. Additionally, the sacrificial material 351b below the semiconductor layer 315 can be divided by the dielectric support structures 329. For example, the sacrificial material 351b can be thin slices while the semiconductor layer 315 can be divided into separate or individual lines.

In some embodiments, in order to form the layer stack 350, a layer of a first dielectric 303 is deposited on silicon (e.g. 301) or another substrate. Using a bottom DRAM gate access mask, the layer of the first dielectric 303 is directionally etched—partially—while keeping insulation with Si substrate (e.g. 301). After stripping off a photoresist, the sacrificial material 351b and 351b' (e.g. a second dielectric) is deposit-filled and planarized, for example by chemical-mechanical polishing (CMP). The capacitor region 354 will be used for forming at least one capacitor which is a long and thin strip. Therefore, it needs some support to bolster its physical stability. Although, it will slightly disturb the capacitance value, the capacitance value would still be in acceptable range.

Then, p-doped polysilicon (e.g. 315) that is relatively lightly doped is deposited before being directionally doped by ion-implantation with n+ dopants using a blocking mask. As a result, an n-doped polysilicon (e.g. 331) is formed and has a different dopant type from other portions of the original p-doped polysilicon (e.g. 315). The source region 336 can be inputs for DRAM, while the drain region 335 and the inner conductor 321 are shorted together. Subsequently, the sacrificial material is deposited before lithography is executed with an isolation DRAM mask to make the sacrificial material discontinuous (e.g. 351a and 351a'). Next, after stripping off a photoresist, the first dielectric 303 is deposit-filled and planarized by CMP.

Note that the substrate 301 can correspond to the substrate 101. The semiconductor layer 315 can correspond to the semiconductor layer 115. The dielectric support structures 329 can correspond to the dielectric support structures 129. The source region 336 can correspond to the source region 136. The channel structure 331 can correspond to the channel structure 131. The drain region 335 can correspond to the drain region 135. The inner conductor 321 can correspond to the inner conductor 121.

FIGS. 5B and 5C can respectively show vertical cross-sectional views taken along line cuts HH' and II' in FIG. 5A. In FIGS. 5A-5C, openings 353 are formed to divide the channel structure 331 into independent channel structure spaced in the Y direction. Through the openings 353, the sacrificial material 351a' and 351b', which is in contact with the channel structure 331 in the transistor region 341, is removed. As a result, the channel structure 331 is exposed.

In some embodiments, a hard mask layer of a third dielectric (e.g. 361) is deposited. Then, lithography is executed with a DRAM gate mask to directionally etch the third dielectric (e.g. 361), the first dielectric 303, the sacrificial material 315a', polysilicon (e.g. 331) and the sacrificial material 315b'. Etch can stop anywhere after passing polysilicon (e.g. 331) or etch stop on Si (e.g. 301). After stripping a photoresist, the sacrificial material 315a' and 315b' is removed by selective etching. This will create space for gate wrapping around p-doped poly.

FIGS. 6B and 6C can respectively show vertical cross-sectional views taken along line cuts JJ' and KK' in FIG. 6A. In FIGS. 6A-6C, a gate structure 332 is formed all around the channel structure 331. As a result, a transistor 330 is formed. The gate structure 332 includes at least one gate dielectric 333 (such as a high-k dielectric) and at least one gate metal 334 (such as a work function metal (WFM)). For example, a thin high-k dielectric (e.g. 333) can be deposited by atomic layer deposition, and a metal can be deposit-filled and planarized by CMP.

Note that the transistor 330 can correspond to the transistor 130. The gate structure 332 can correspond to the gate structure 132. The at least one gate dielectric 333 can correspond to the at least one gate dielectric 133. The at least one gate metal 334 can correspond to the at least one gate metal 134.

FIGS. 7B and 7C can respectively show vertical cross-sectional views taken along line cuts LL' and MM' in FIG. 7A. In FIGS. 7A-7C, openings 355 are formed to divide the inner conductor 321 into independent inner conductors spaced in the Y direction. Through the openings 355, the sacrificial material 351a and 351b, which is in contact with the inner conductor 321 in the capacitor region 342, is removed. As a result, the inner conductor 321 is exposed. Note that the dielectric support structures 329 can be configured to provide structural support (or physical support, or mechanical support) to prevent collapse of the inner conductor 321 when the sacrificial material 351a and 351b is removed.

In some embodiments, similar to FIGS. 5A-5C, lithography is executed with a DRAM capacitor mask to etch directionally a hard mask layer of a fourth dielectric (e.g. 363), the first dielectric 303, the sacrificial material 351a, polysilicon (e.g. 331), the sacrificial material 351b and the dielectric support structures 329. Etch can stop anywhere after passing polysilicon (e.g. 321) or etch stop on Si (e.g. 301). Then, a photoresist is stripped off, and the sacrificial material 351a and 351b can be removed by selective etching. The pillars (e.g. 329) can support a thin and long n-type polysilicon (e.g. 321).

FIG. 8B can show a vertical cross-sectional view taken along the line cut NN' in FIG. 8A. In FIGS. 8A-8B, a capacitor dielectric 323 (also shown as 323a and 323b) is formed all around the inner conductor 321, and an outer conductor 325 (also shown as 325a and 325b) is formed all around the capacitor dielectric 323. As a result, a capacitor 320 is formed, and a cell unit 311 (or a memory cell unit) is formed. For example, a high-k dielectric (e.g. 323) can be formed by ALD, and a metal (e.g. 325) can be deposited and planarized by CMP. Different high-k dielectric and/or metal can also be used as per requirement.

Note that the cell unit 311 can correspond to the cell unit 111. The capacitor 320 can correspond to the capacitor 120. The capacitor dielectric 323, 323a and 323b can respectively correspond to the capacitor dielectric 123, 123a and 123b. The outer conductor 325, 325a and 325b can respectively correspond to the outer conductor 125, 125a and 125b.

Figure 9D:
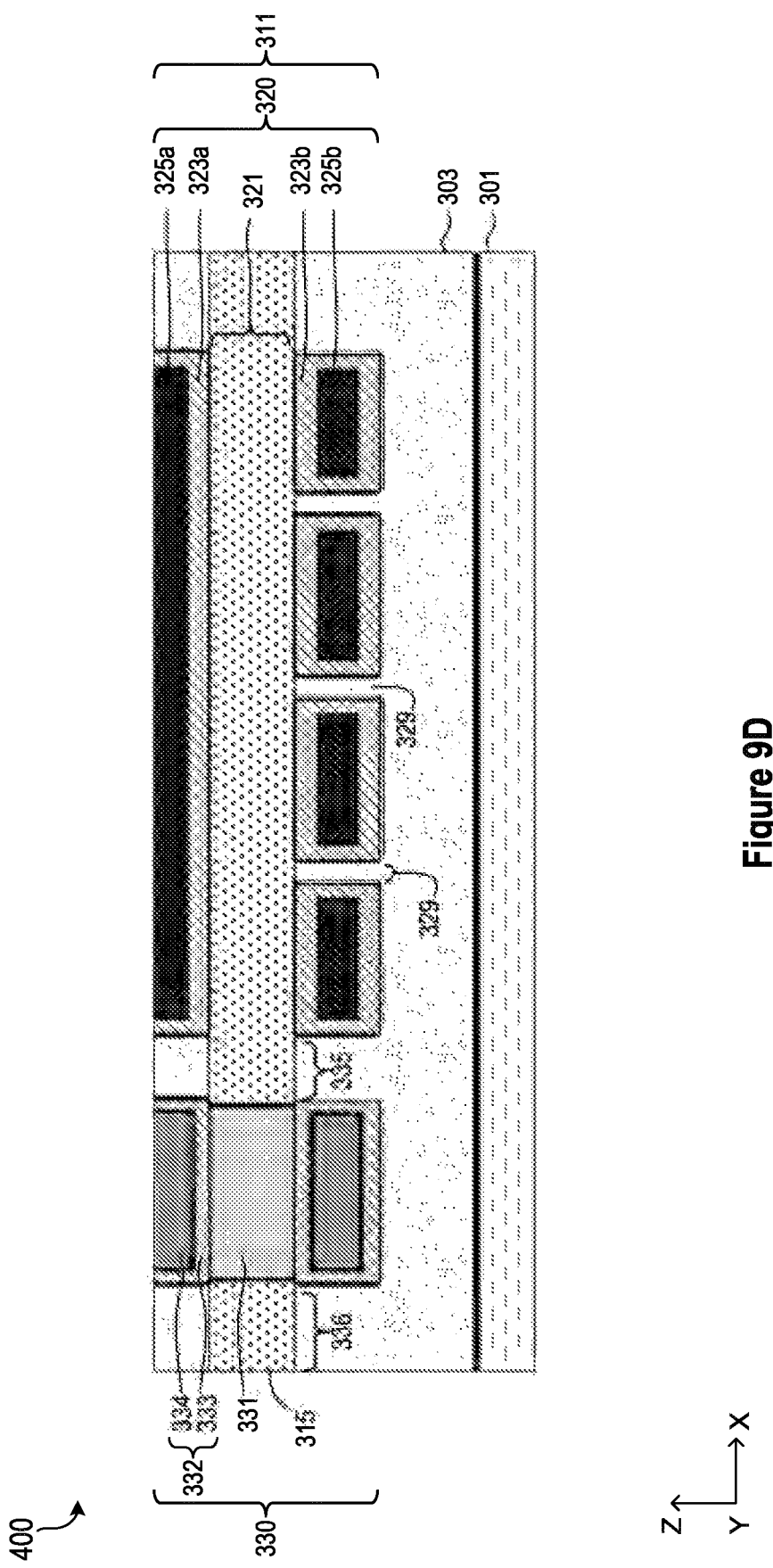

FIGS. 9B, 9C and 9D can respectively show vertical cross-sectional views taken along line cuts PP', QQ' and RR' in FIG. 9A. In FIGS. 9A-9D, isolation structures (e.g. 303) are formed between transistors 330 arranged in the Y direction. For example, lithography can be executed with a slicing mask to directionally etch materials until the end of the first dielectric (e.g. 303) or etch stop at Si (e.g. 301). After stripping off a photoresist, the first dielectric (e.g. 303) is deposit-filled and then planarized by CMP. As a result, the semiconductor device 400 can become the semiconductor device 100. While not shown, any number of cell units 311 can be stacked in the Z direction.

FIGS. 10A, 11A, 12A, 13A, 14A, 15A, 16A and 17A show top views of a semiconductor device 500 at various intermediate steps of manufacturing, in accordance with some embodiments of the present disclosure. In the examples of FIGS. 4A-9A, when slicing, all other remaining doped Si (e.g. 315 in FIGS. 9A-9D) has been separated. FIGS. 10A-17A can show an alternative embodiment which is to slice the doped polysilicon early and then build the device. Besides that, FIGS. 10A-17A includes a hierarchy concept of N-number of DRAM access.

FIG. 10B can show a vertical cross-sectional view taken along the line cut SS' in FIG. 10A. In FIGS. 10A-10B, a layer stack 350' is formed over the substrate 301. Specifically, the layer stack 350' includes a semiconductor layer 315b formed over the substrate 301, a semiconductor layer 315a formed over the semiconductor layer 315b, dielectric support structures 329a and 329b, and the sacrificial material 351 (e.g. shown as 351a, 351a', 351b, 351b', 351c and 351c'). The dielectric support structures 329a are formed below and in contact with the semiconductor layer 315a and spaced along the X direction. The dielectric support structures 329b are formed below and in contact with the semiconductor layer 315b and spaced along the X direction. The sacrificial material 351 is formed over (e.g. 351a and 351a') and below (e.g. 351b and 351b') the semiconductor layer 315a as well as formed over (e.g. 351b and 351b') and below (e.g. 351c and 351c') the semiconductor layer 315b. The semiconductor layer 315b (or 315a) can include the source region 336, the channel structure 331 and the drain region 335 in the transistor region 341 and the inner conductor 321 in the capacitor region 342. Additionally, the sacrificial material 351b below the semiconductor layer 315a can be divided by the dielectric support structures 329a while the sacrificial material 351c below the semiconductor layer 315b can be divided by the dielectric support structures 329b.

In some embodiments, the layer stack 350' herein can be formed in a similar way to the layer stack 350 in FIGS. 4A-4B. That is, the sacrificial material 351c and 351c' and the dielectric support structures 329b can be formed similarly to the sacrificial material 351b and 351b' and the dielectric support structures 329 respectively. Likewise, the semiconductor layers 315a and 315b can be formed similarly to the semiconductor layer 315 by directional doping.

Note that the semiconductor layers 315*a* and 315*b* can each correspond to the semiconductor layer 315. The dielectric support structures 329*a* and 329*b* can correspond to the dielectric support structures 329. The sacrificial material 351*c* and 351*c*' can correspond to the sacrificial material 351*b* and 351*b*'.

FIGS. 11B and 11C can respectively show vertical cross-sectional views taken along line cuts TT' and UU' in FIG. 11A. In FIGS. 11A-11C, the layer stack 350' is divided into separate or independent layer stacks spaced in the Y direction, for example by using an early slicing DRAM mask to etch through layers of the layer stack 350' with etch stop at Si (e.g. 301) or the first dielectric 303. Note that this step is different from the examples of FIGS. 4A-9A as explained above.

FIGS. 12B and 12C can respectively show vertical cross-sectional views taken along line cuts VV' and WW' in FIG. 12A. In FIGS. 12A-12C, a photoresist 365 is stripped off, and the first dielectric 303 is deposit-filled and then planarized by CMP.

FIGS. 13B and 13C can respectively show vertical cross-sectional views taken along line cuts XX' and YY' in FIG. 13A. In FIGS. 13A-13C, the first dielectric 303 in the transistor region 341 is removed before the sacrificial material 351*a*', 351*b*' and 351*c*' in the transistor region 341 is selectively removed. For example, a hard mask 367 (e.g. a dielectric) can be formed, and a DRAM gate mask can be used to directionally etch the first dielectric 303 in the transistor region 341. After stripping off a photoresist, the third dielectric (e.g. 351*a*', 351*b*' and 351*c*') can be removed from the transistor region 341 by selective etching.

FIGS. 14B and 14C can respectively show vertical cross-sectional views taken along line cuts AAAA' and BBBB' in FIG. 14A. In FIGS. 14A-14C, the gate structure 332 is formed all around the channel structure 331. As a result, transistors 330 are formed. The gate structure 332 includes the at least one gate dielectric 333 and the at least one gate metal 334. For example, a thin high-k dielectric (e.g. 333) can be deposited by atomic layer deposition, and a metal can be deposit-filled and planarized by CMP.

Figure 15A:
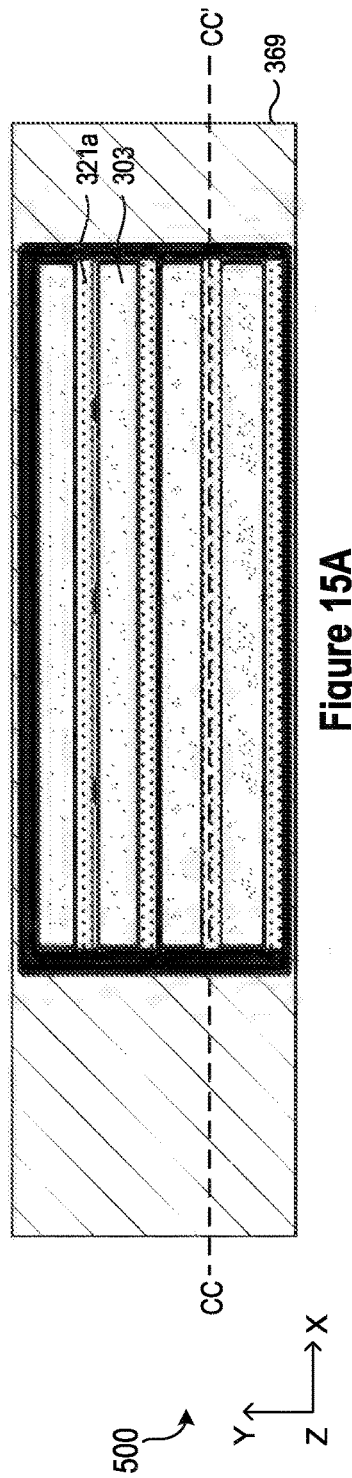
Figure 15B:
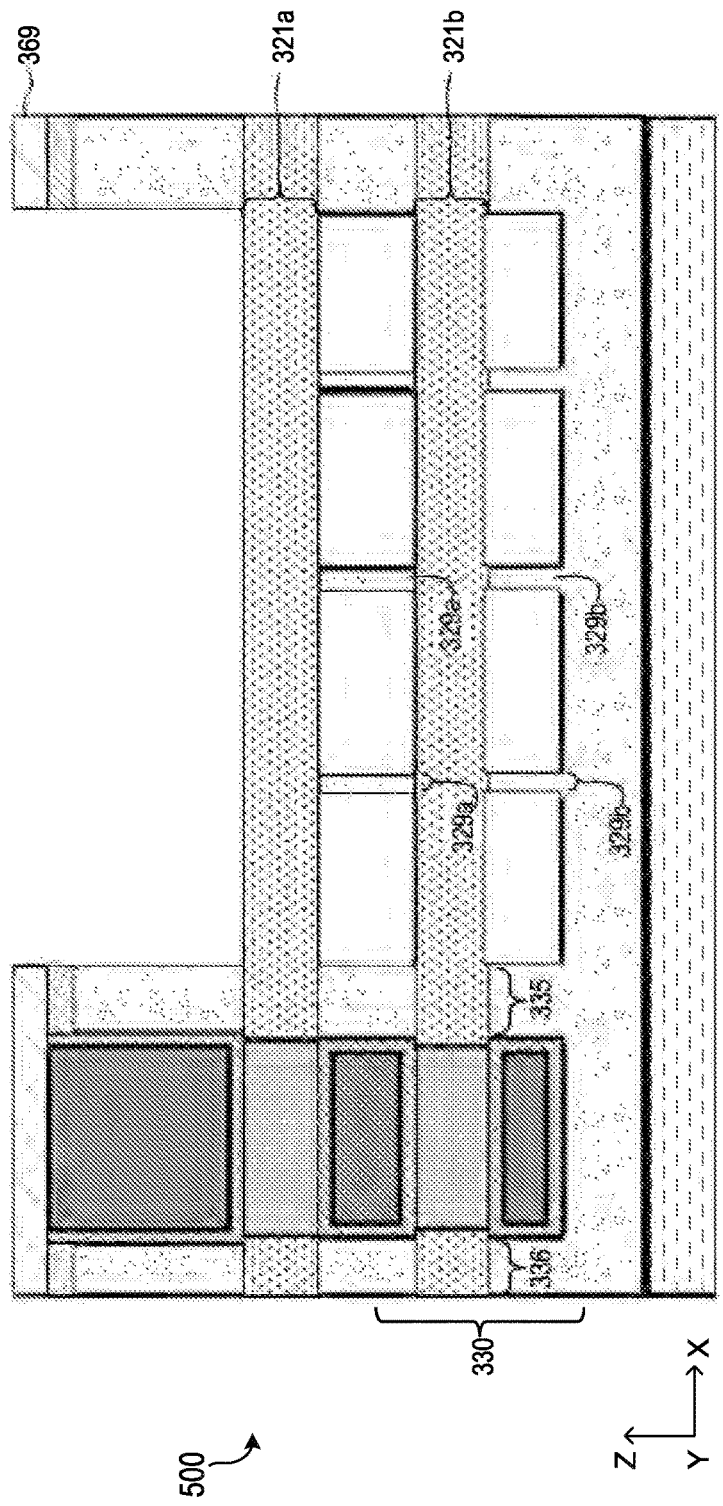

FIG. 15B can show a vertical cross-sectional view taken along the line cut CCCC' in FIG. 15A. In FIGS. 15A-15B, the inner conductors 321*a* and 321*b* are divided into independent inner conductors spaced in the Y direction. The sacrificial material 351*a*, 351*b* and 351*c*, which is in contact with the inner conductors 321*a* and 321*b* in the capacitor region 342, is removed. As a result, the inner conductors 321*a* and 321*b* are exposed. Note that the dielectric support structures 329*a* and 329*b* can be configured to provide structural support (or physical support, or mechanical support) to prevent collapse of the inner conductors 321*a* and 321*b* when the sacrificial material 351*a*, 351*b* and 351*c* is removed.

In some embodiments, similar to FIGS. 7A-7C, lithography can be executed using a DRAM capacitor mask (e.g. 369) to directionally etch the first dielectric 303, the sacrificial material 351*a*, the inner conductor 321*a*, the sacrificial material 351*b* and the dielectric support structures 329*a*, the inner conductor 321*b*, and the sacrificial material 351*c* and the dielectric support structures 329*b*. Then, the third dielectric (e.g. 351*a*, 351*b* and 351*c*) can be removed from the capacitor region 342 by selective etching.

FIGS. 16B and 16C can respectively show vertical cross-sectional views taken along line cuts DDDD' and EEEE' in FIG. 16A. In FIGS. 16A-16C, the capacitor dielectric 323 (also shown as 323*a*, 323*b* and 323*c*) is formed all around the inner conductors 321*a* and 321*b*, and the outer conductor 325 (also shown as 325*a*, 325*b* and 325*c*) is formed all around the capacitor dielectric 323. As a result, capacitors 320*a* and 320*b* are formed, and cell units 311 are formed. For example, a high-k dielectric (e.g. 323) can be formed by ALD, and a metal (e.g. 325) can be deposited and planarized by CMP. Different high-k dielectric and/or metal can also be used as per requirement. Note that the capacitor dielectric 323*c* can correspond to the capacitor dielectric 123*b*. The outer conductor 325*c* can correspond to the outer conductor 125*b*.

Figure 17A:
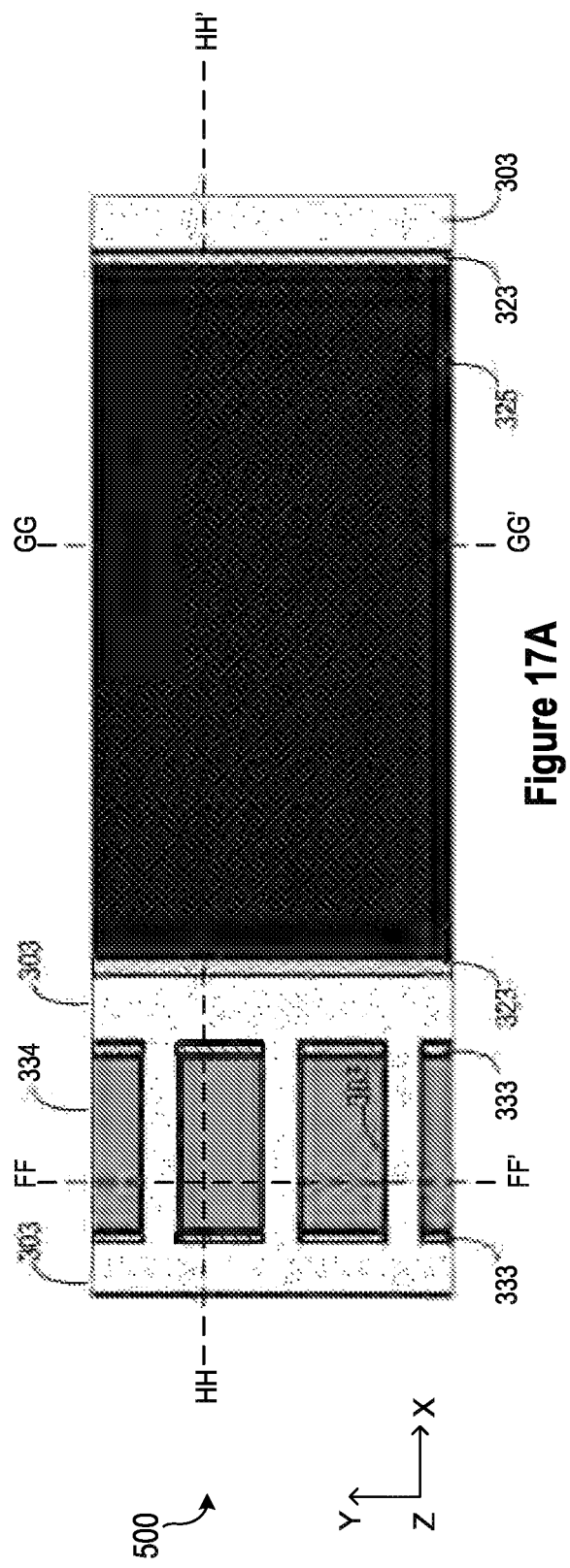
Figure 17C:
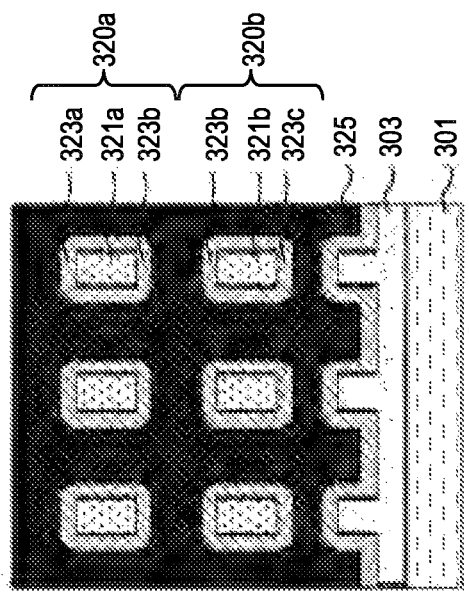
Figure 17B:
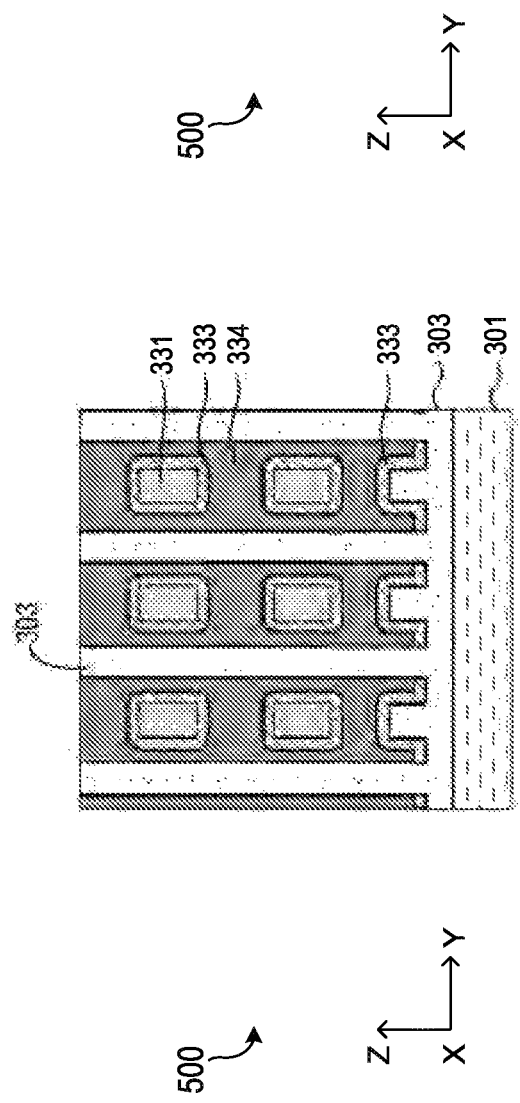
Figure 17D:
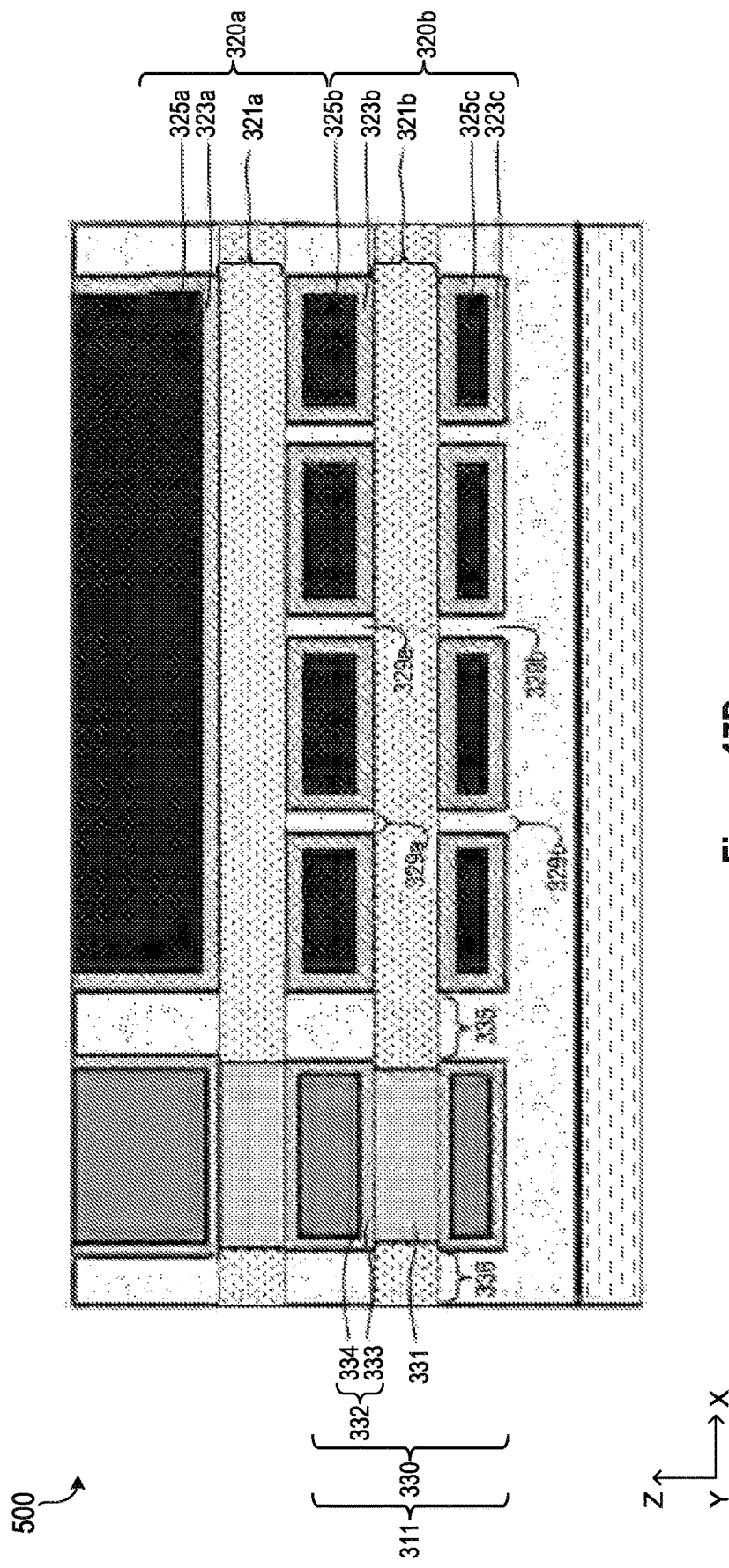

FIGS. 17B, 17C and 17D can respectively show vertical cross-sectional views taken along line cuts FFFF', GGGG' and HHHH' in FIG. 17A. In FIGS. 17A-17D, isolation structures (e.g. 303) are formed between transistors 330 arranged in the Y direction. As a result, the semiconductor device 500 can become the semiconductor device 200. It should be understood that any number of cell units 311 can be stacked in the Z direction. For example, lithography can be executed with a slicing mask to directionally etch materials until the end of the first dielectric 303 or etch stop at Si (e.g. 301). After stripping off a photoresist, the first dielectric 303 is deposit-filled and then planarized by CMP. Note that the slicing mask herein is different from that of FIGS. 9A-9D. Because an early DRAM mask has been used to etch all the way in FIGS. 11A-11C, this step is only slicing nanosheet transistors (e.g. 330) without touching (or etching) the capacitors (e.g. 320*a* and 320*b*).

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "wafer" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The substrate can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate may be a bulk wafer or an epitaxial layer.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device, comprising:
a memory cell unit positioned over a substrate, wherein the memory cell unit comprises a transistor and a capacitor,
wherein the capacitor comprises:
an inner conductor,
a capacitor dielectric all around the inner conductor,
an outer conductor all around the capacitor dielectric, and
dielectric support structures below the inner conductor, where the capacitor is elongated in a length direction parallel to a working surface of the substrate, and the dielectric support structures are spaced along the length direction,
wherein the transistor comprises:
a channel structure,
a gate structure all around the channel structure, and
source/drain (S/D) regions on opposing ends of the channel structure.

2. The semiconductor device of claim 1, wherein:
the capacitor dielectric and the outer conductor, below the inner conductor, are divided by the dielectric support structures and are discontinuous along the length direction.

3. The semiconductor device of claim 2, wherein:
the capacitor dielectric and the outer conductor, above the inner conductor, are undivided and are continuous along the length direction.

4. The semiconductor device of claim 1, wherein:
the dielectric support structures are in contact with the inner conductor.

5. The semiconductor device of claim 1, wherein:
the dielectric support structures are surrounded by the outer conductor below the inner conductor.

6. The semiconductor device of claim 1, wherein:
a plurality of the memory cell units are stacked over the substrate in a vertical direction perpendicular to the working surface of the substrate.

7. The semiconductor device of claim 6, wherein:
each capacitor dielectric and each outer conductor, below an uppermost inner conductor, are divided by respective dielectric support structures and are discontinuous along the length direction, and
an uppermost capacitor dielectric and an uppermost outer conductor, above the uppermost inner conductor, are undivided and are continuous along the length direction.

8. The semiconductor device of claim 6, wherein the plurality of the memory cell units comprises:
a common gate structure for a plurality of transistors; and
a common outer conductor for a plurality of capacitors.

9. The semiconductor device of claim 1, wherein:
the memory cell unit comprises a semiconductor layer that includes a source region of the transistor, the channel structure of the transistor, a drain region of the transistor, and the inner conductor of the capacitor connected in series.

10. The semiconductor device of claim 9, wherein:
the semiconductor layer comprises doped silicon, and
the channel structure includes a different dopant type from the source region, the drain region and the inner conductor.

11. The semiconductor device of claim 1, wherein:
the inner conductor, the capacitor dielectric, and the outer conductor are co-axial.

12. The semiconductor device of claim 1, further comprising:
a plurality of the memory cell units arranged in a width direction that is parallel to a working surface of the substrate and perpendicular to the length direction;
isolation structures separating a plurality of transistors of the plurality of the memory cell units; and
a common outer conductor for a plurality of capacitors of the plurality of the memory cell units.

13. A method of manufacturing a semiconductor device, the method comprising:
forming a layer stack over a substrate by:
forming a semiconductor layer over the substrate,
forming dielectric support structures that are below and in contact with the semiconductor layer and spaced along a length direction parallel to a working surface of the substrate, and
forming a sacrificial material over and below the semiconductor layer, wherein the sacrificial material below the semiconductor layer is divided by the dielectric support structures;
forming a capacitor by removing the sacrificial material while the dielectric support structures remain in contact with the semiconductor layer, wherein the capacitor is elongated in the length direction; and
forming a transistor adjacent to the capacitor.

14. The method of claim 13, wherein:
the dielectric support structures are configured to provide structural support to prevent collapse of the semiconductor layer when the sacrificial material is removed.

15. The method of claim 13, further comprising:
doping the semiconductor layer such that the semiconductor layer comprises source/drain regions and a channel structure of the transistor, and an inner conductor of the capacitor.

16. The method of claim 15, further comprising:
removing a portion of the sacrificial material in contact with the inner conductor;
forming a capacitor dielectric all around the inner conductor; and
forming an outer conductor all around the capacitor dielectric.

17. The method of claim 16, wherein:
the capacitor dielectric and the outer conductor, below the inner conductor, are divided by the dielectric support structures and are discontinuous along the length direction, and
the capacitor dielectric and the outer conductor, above the inner conductor, are undivided and are continuous along the length direction.

18. The method of claim 15, further comprising:
removing a portion of the sacrificial material in contact with the channel structure; and forming a gate structure all around the channel structure.

19. The method of claim 13, further comprising:
dividing the semiconductor layer in a width direction that is parallel to the working surface of the substrate and perpendicular to the length direction;
forming a plurality of transistors spaced in the width direction; and
forming a plurality of capacitors in the width direction.

20. The method of claim 13, wherein the forming the layer stack further comprises:
forming an additional semiconductor layer over the semiconductor layer;
forming additional dielectric support structures below and in contact with the additional semiconductor layer and spaced along the length direction; and
forming the sacrificial material over the additional semiconductor layer, wherein the sacrificial material below the additional semiconductor layer is divided by the additional dielectric support structures.

\* \* \* \* \*